(12) United States Patent
Konishi

(10) Patent No.: US 11,662,436 B2
(45) Date of Patent: May 30, 2023

(54) MOUNT, MOVABLE DEVICE, LIDAR DEVICE, IMAGE FORMING APPARATUS, AND IMAGE PROJECTION APPARATUS

(71) Applicant: Ricoh Company, Ltd., Tokyo (JP)

(72) Inventor: Junichi Konishi, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 294 days.

(21) Appl. No.: 17/084,954

(22) Filed: Oct. 30, 2020

(65) Prior Publication Data

US 2021/0149025 A1 May 20, 2021

(30) Foreign Application Priority Data

Nov. 19, 2019 (JP) .............................. JP2019-209074

(51) Int. Cl.
*G01S 17/18* (2020.01)
*G01S 7/481* (2006.01)
*G02B 26/10* (2006.01)

(52) U.S. Cl.
CPC .......... *G01S 7/4817* (2013.01); *G02B 26/105* (2013.01); *G01S 17/18* (2020.01)

(58) Field of Classification Search
None
See application file for complete search history.

(56) References Cited

U.S. PATENT DOCUMENTS

2007/0025659 A1* 2/2007 Yoda ..................... G02B 6/3578
385/15

FOREIGN PATENT DOCUMENTS

JP 2000-214407 8/2000
JP 2020-101588 7/2020

* cited by examiner

*Primary Examiner* — Elmito Breval
(74) *Attorney, Agent, or Firm* — Xsensus LLP

(57) ABSTRACT

A movable device includes a light deflector including a movable part rotatable about a predetermined axis; a mount including a pair of stationary parts to which the light deflector is secured; and a substrate attached to an opposite side of a light-deflector side of the mount. The substrate has a through hole between the pair of the stationary parts.

19 Claims, 33 Drawing Sheets

MOUNT, MOVABLE DEVICE, LIDAR DEVICE, IMAGE FORMING APPARATUS, AND IMAGE PROJECTION APPARATUS

CROSS-REFERENCE TO RELATED APPLICATIONS

This patent application is based on and claims priority pursuant to 35 U.S.C. § 119(a) to Japanese Patent Application No. 2019-209074, filed on Nov. 19, 2019, in the Japan Patent Office, the entire disclosure of which is hereby incorporated by reference herein.

BACKGROUND

Technical Field

The present disclosure relates to a mount, a movable device, a light detection and ranging (LiDAR) device, an image forming apparatus, and an image projection apparatus.

Related Art

In recent years, with the development of micromachining technology applying semiconductor manufacturing technology, development of micro electro mechanical systems (MEMS) devices manufactured by micromachining silicon or glass is advancing.

As a MEMS device, there is known a movable device that includes a drive beam including an elastic beam and a movable portion including a reflecting surface, which are combined as a single unit on a wafer, the drive beam also including a thin film of a piezoelectric material superposed on the elastic beam, and that drives (rotates) the movable portion using the drive beam.

SUMMARY

In one aspect of this disclosure, there is described a movable device including a light deflector including a movable part rotatable about a predetermined axis; a mount including a pair of stationary parts to which the light deflector is secured; and a substrate attached to an opposite side of a light-deflector side of the mount. The substrate has a through hole between the pair of the stationary parts.

In another aspect of this disclosure, there is disclosed a mount including a pair of stationary parts configured to secure a light deflector including a movable part having a reflecting surface, the movable device being rotatable around a predetermined axis; and a connecting part at an opposite side of a reflecting-surface side of the pair of the stationary parts, the connecting part connecting the pair of stationary parts. An opening region is provided through which light reflected by the reflecting surface passes. The connecting part has a smaller width in a direction orthogonal to the predetermined axis than the pair of stationary parts.

In even another aspect of this disclosure, there is disclosed s movable device including the above-described mount and the light deflector attached to the pair of connecting parts.

In still another aspect of this disclosure, a laser imaging detection and ranging device includes the above-described movable device.

Further described is an image forming apparatus including the movable device.

Still further described is an image projection apparatus including a light source configured to emit light; and the movable device configured to deflect the light.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
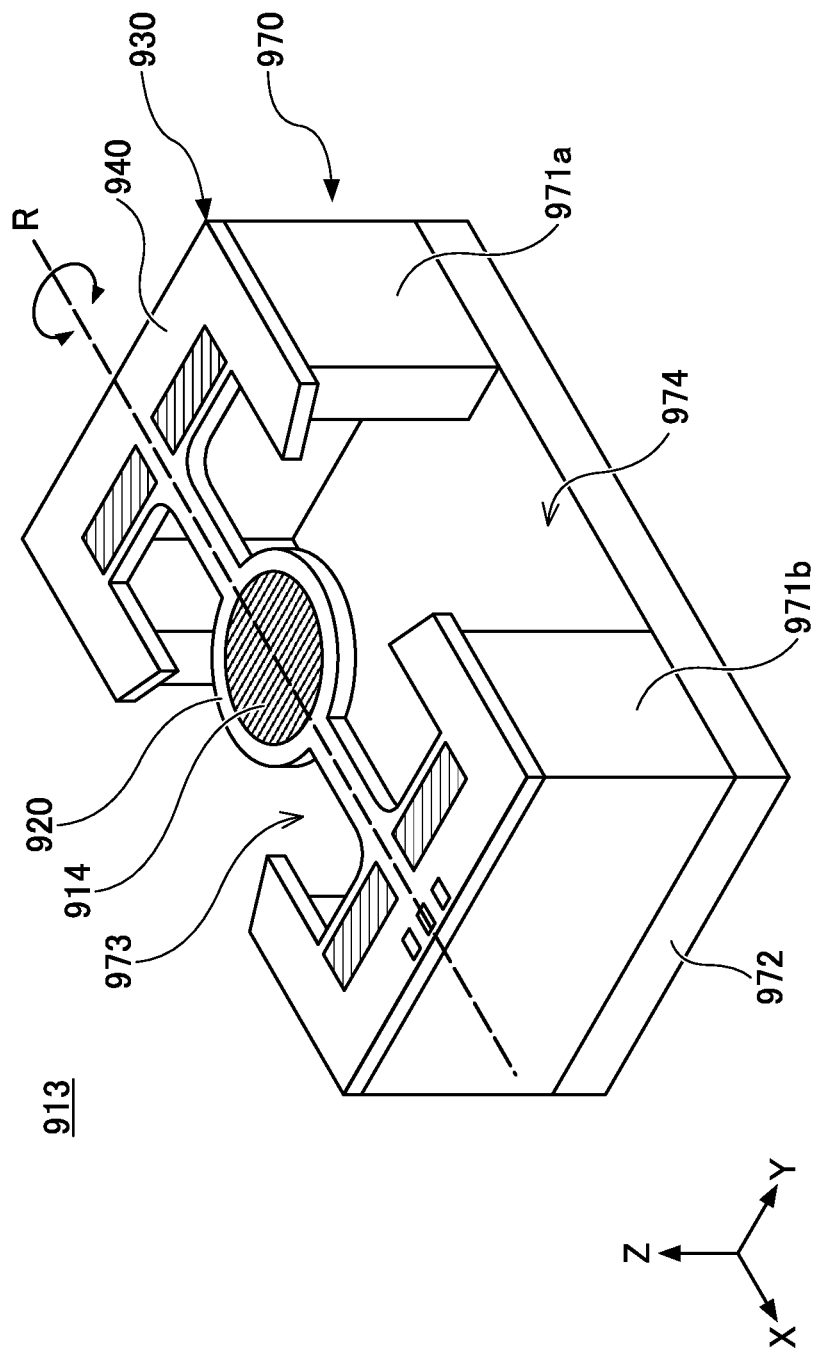
FIG. 1 is a perspective view of a movable device.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

The embodiments of the present disclosure provide a mount that achieves a stable rotation of a movable part of a movable device.

Embodiments of the present disclosure are described below with reference to the drawings. In the drawings, like reference signs denote like elements, and overlapping description may be omitted.

In the present disclosure, an X direction, a Y direction, and a Z direction are directions orthogonal to each other. A surface including the X direction and the Y direction is referred to as an XY plane, a surface including the Y direction and the Z direction is referred to as a YZ plane, and a surface including the Z direction and the X direction is referred to as a ZX plane.

First, a movable device 913 is described with reference to FIG. 1. The movable device 913 in FIG. 1 is provided with a movable part chip 930 and a mounting unit 970 below a supporting unit 940 included in the movable part chip 930. The supporting unit 940 of the movable part chip 930 is secured to the mounting unit 970.

Figure 2:
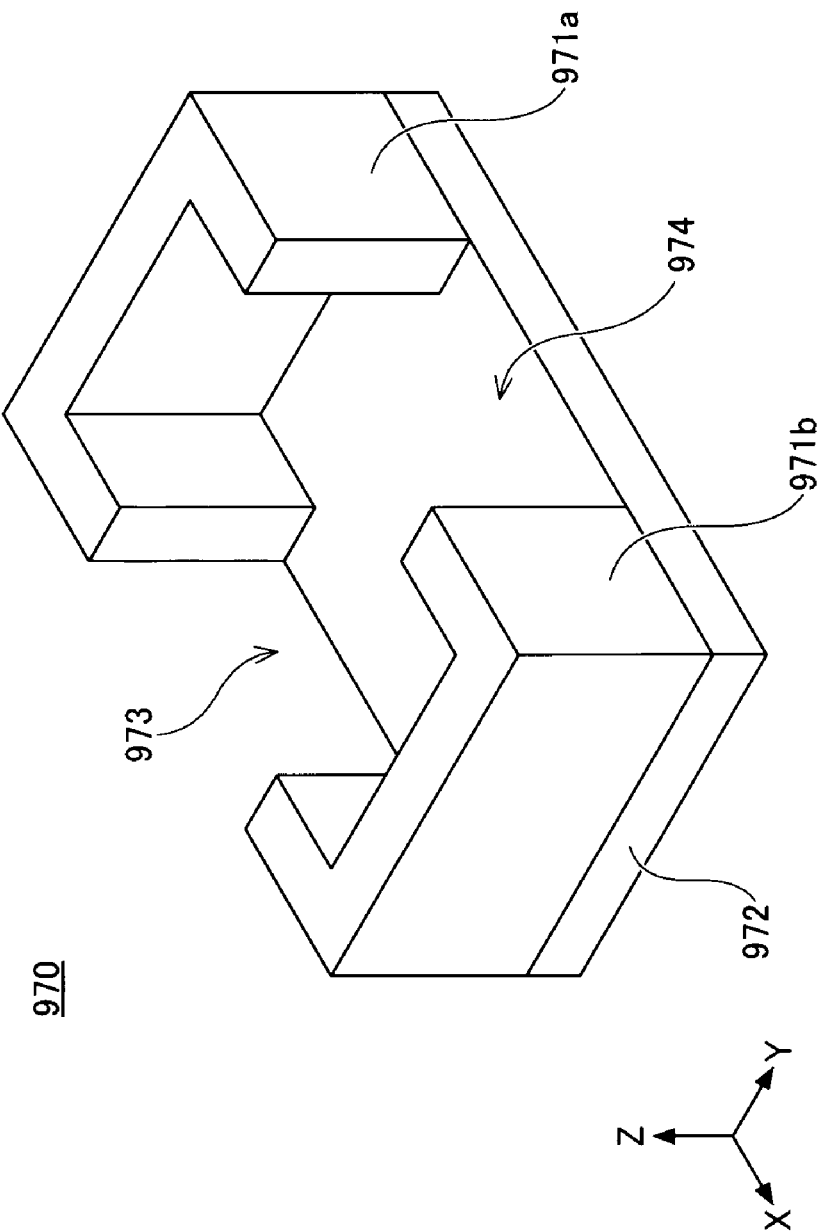
FIG. 2 is a perspective view of a mounting unit.

As illustrated in FIG. 2, the mounting unit 970 includes a pedestal portion 970 has side wall parts 971a and 971b and a bottom substrate 972. The side wall part 971a has a cross section of an angular U shape parallel to the XY plane. The bottom substrate 972 is a plate-shaped member. The side wall part 971a is secured by, for example, bonding to the +Z surface of the bottom substrate 972 such that the open side of the angular U-shaped part faces in the +X direction. The side wall part 971b also has a cross section of an angular U shape parallel to the XY plane. The side wall part 971b is secured by, for example, bonding to the +Z surface of the bottom substrate 972 such that the open side of the angular U-shaped part faces in the −X direction.

The supporting unit 940 of the movable part chip 930 is secured onto the +Z-side top surfaces of the side wall parts 971a and 971b. The side wall parts 971a and 971b are spaced apart from each other in the X direction. This arrangement provides an open region 973 at −Y side of the mounting unit 970 and an open region 974 at +Y side of the mounting unit 970. The open region 973 and open region 974 are an example of an open region that opens part of side wall members constituted of the side wall parts 971a and 971b.

Figure 3:
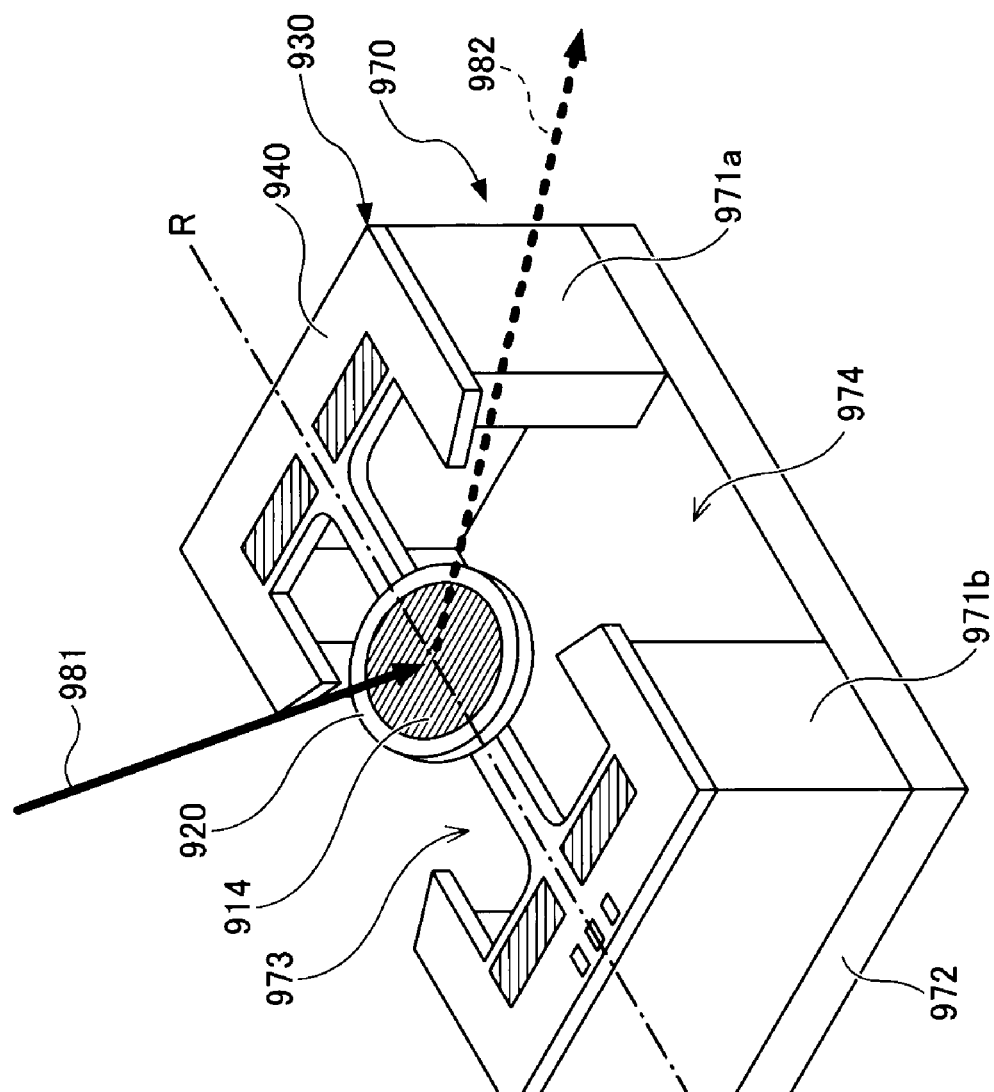
FIG. 3 is a perspective view of the movable device with a movable part rotated.

FIG. 3 is an illustration of the movable device 913 with a movable part 920 of the movable part chip 930 being rotated (driven), according to an embodiment. In FIG. 3, the movable part chip 930 is secured to the +Z surfaces of the side wall parts 971a and 971b. The movable part 920 of the movable part chip 930 rotates around the R-axis and receives the light incident on the reflecting surface 914 in the direction indicated by a thick-solid-line arrow 981, and the reflecting surface 914 reflects the light in a direction indicated by a thick-broken-line arrow 982.

Since the open regions 973 and 974 are formed on the ±Y sides of the mounting unit 970, as illustrated in FIG. 3, any member that blocks the light reflected by the reflecting surface 914 is not present on the ±Y sides of the movable part 920. This arrangement provides a space that allows the light reflected by the reflecting surface 914 to pass therethrough. Moreover, since the supporting unit 940 of the movable part chip 930 is secured at the +Z surfaces of the side wall parts 971a and 971b, a space that allows the light reflected by the reflecting surface 914 to pass therethrough at an angle in a predetermined angular range is provided also on the −Z side of the movable part 920.

The open regions 973 and 974 allow the light reflected by the reflecting surface 914 to pass therethrough even when the movable part 920 is largely rotated. To allow the light reflected by the reflecting surface 914 to pass, the open regions 973 and 974 desirably have widths in the X direction larger than the width of the reflecting surface 914 in the X direction.

Figure 4:
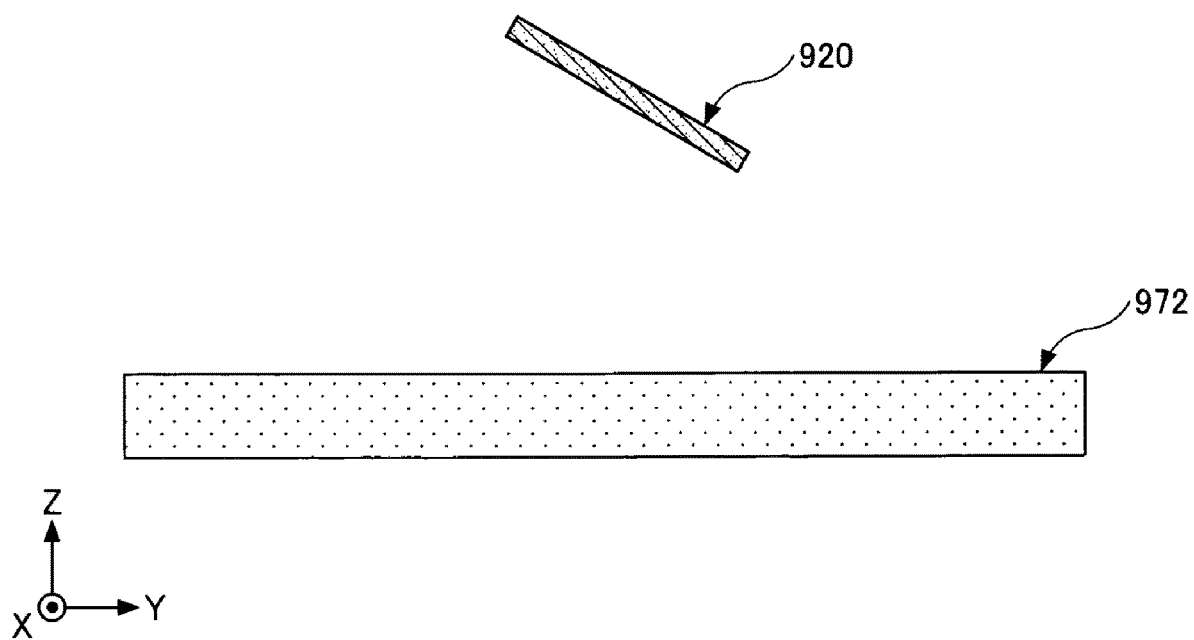
FIG. 4 is a cross-sectional view of the movable device with the movable part rotated.

FIG. 4 is a cross-sectional view of the movable device 913 in FIG. 3 taken along a plane including the center of the movable part 920 parallel to the YZ plane.

When the movable part 920 rotates about the R-axis, one side (the right side in FIG. 4) of the movable part 920 approaches the bottom substrate 972 of the mounting unit 970, and the other side (the left side in FIG. 4) of the movable part 920 moves away from the bottom substrate 972. Accordingly, air is compressed near to cause an increase in air pressure near the area where one side of the movable part 920 is closer to the bottom substrate 972, and air is expanded to cause a decrease in air pressure near the area where the other side of the movable part 920 is farther from the bottom substrate 972. This causes an air-pressure difference in a space between the movable part 920 and the bottom substrate 972 of the mounting unit 970, which further causes an airflow flowing from a high-pressure area to a low-pressure area. Further, since the movable part 920 is rotating at a high speed, the movable part 920 might be tilted in the opposite direction to the direction in FIG. 4. In this case, an airflow in the opposite direction of the above-described airflow occurs.

As described above, rotating the movable part 920 around the R-axis generates alternating airflows in the space between the bottom substrate 972 and the movable part 920. Further, high-speed rotation of the movable part 920 around the R-axis switches the directions of the airflows at high speed, which causes a turbulent airflow. Such a turbulent airflow acts on the movable part 920 in a direction that pushes up or down the movable part 920, which might adversely affect and hamper the rotation of the movable part 920. Specifically, such a turbulent airflow might hamper the movable part 920 of the movable device 913 from stably rotating. Such an adverse effect becomes particularly noticeable when the size of the movable part 920 is large or when the frequency of rotation of the movable part 920 is high.

Next, a movable device 13 according to the first embodiment is described with reference to FIG. 5. The movable device 13 according to the first embodiment includes a mounting board 101, two stationary parts 103a and 103b that constitute a mounting unit, and a movable part chip 104. The mounting board 101 has a through hole 102 at the central portion thereof. The two stationary parts 103a and 103b are bonded to +Z surface of the mounting board 101 such that the through hole 102 is between the stationary parts 103a and 103b. Further, the movable part chip 104 is bonded to the upper surface on the +Z side of the stationary parts 103a and 103b. In other words, the movable part chip 104 is attached to the upper surface on the +Z side of the stationary parts 103a and 103b that constitute the mounting unit, and the mounting board 101 is attached to the −Z surface of the stationary parts 103a and 103b, that is, the opposite side of the side where the movable part chip 104 is attached. In the present disclosure, the movable part chip is sometimes referred to as a light deflector.

The stationary parts 103a and 103b are a pair, and a space is provided between the stationary parts 103a and 103b bonded to the mounting board 101. This space forms pass-through areas 105a and 105b through which light reflected by the reflecting surface 14 passes when the movable part 120 is rotated about the R-axis. The light reflected by the reflecting surface 14 is along a direction orthogonal to the R-axis.

Figure 6:
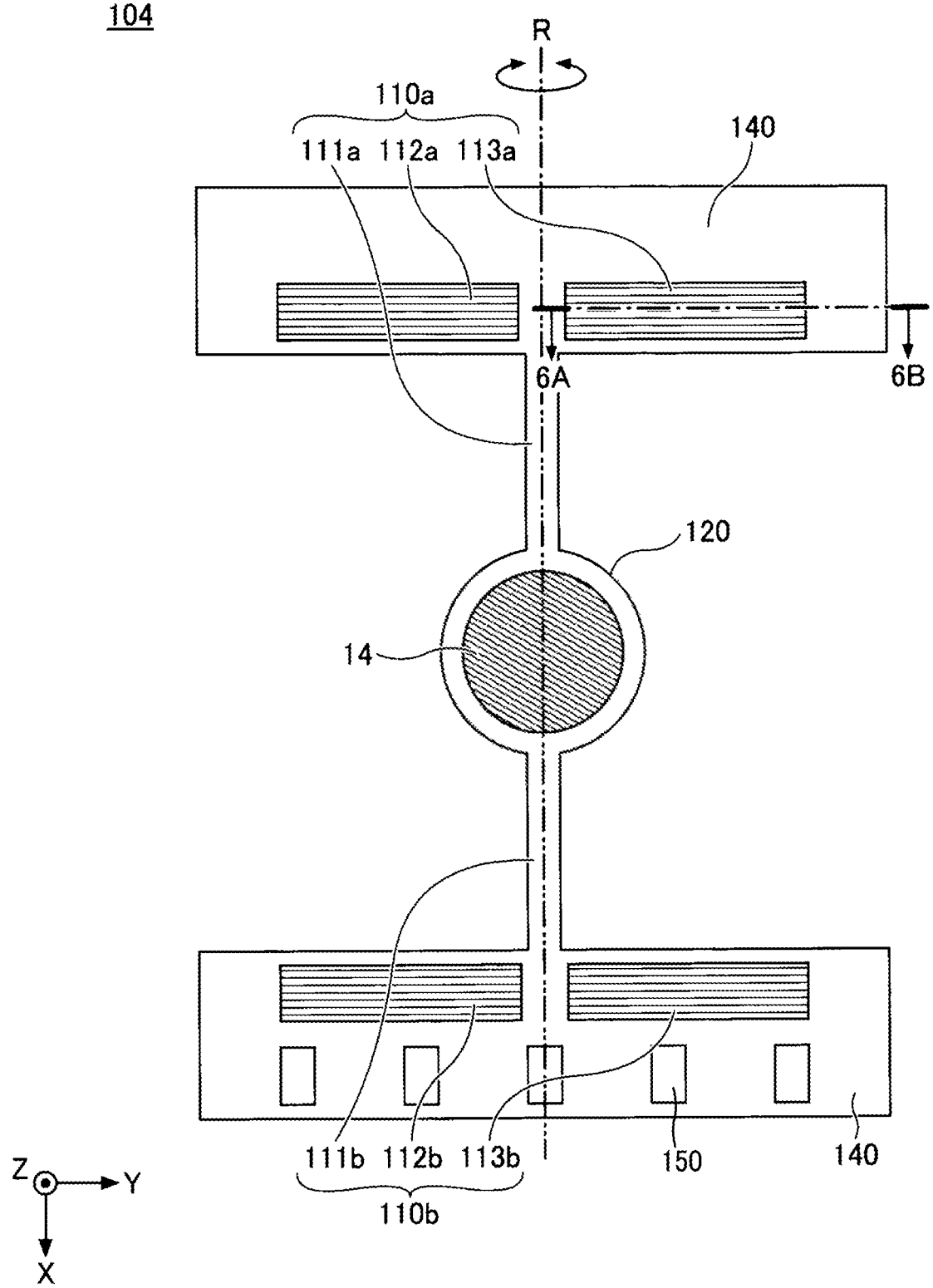
FIG. 6 is a top view of a movable part chip of the movable device according to the first embodiment.
Figure 7:
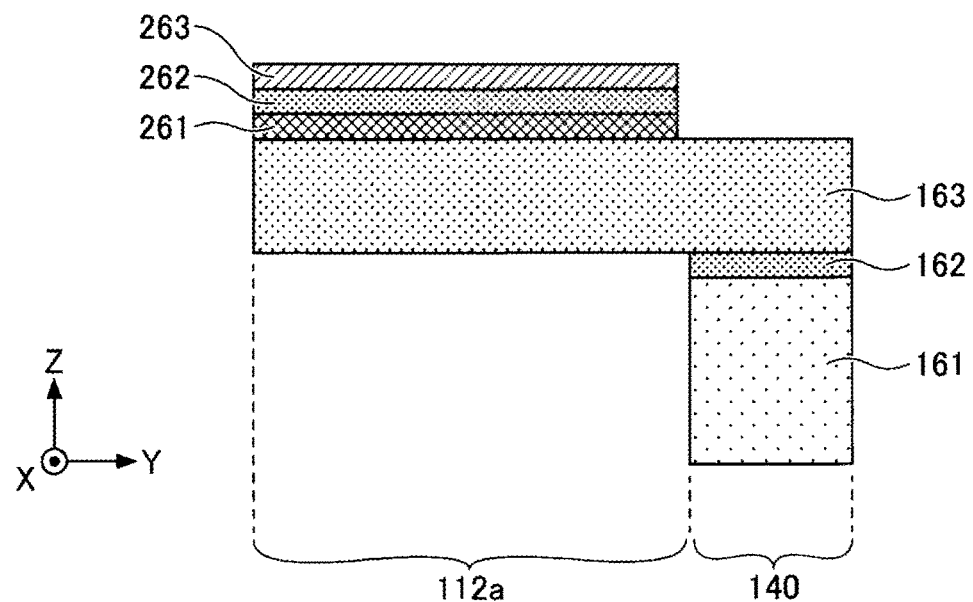
FIG. 7 is a cross-sectional view of the movable part chip of the movable device according to the first embodiment.

Next, the movable part chip 104 is described with reference to FIGS. 6 and 7. FIG. 6 is a top view of the movable part chip 104, and FIG. 7 is a cross-sectional view taken along the chain line 6A-6B in FIG. 6.

The movable part chip 104 includes a movable part 120 and drive beams 110a and 110b that drive the movable part 120 to rotate around the R-axis parallel to the X-axis. Moreover, a wiring portion that transmits a current or voltage signal applied via electrode connecting parts 150 is provided in a region on the movable part 120 other than a reflecting surface 14 and on the drive beams 110a and 110b. In this case, the drive beams 110a and 110b are an example of a pair of drive beams. Alternatively, two or more drive beams may be used. Referring to FIG. 7, each supporting unit 140 is a support body including a silicon support layer 161, a silicon oxide layer 162, and a silicon layer 163. The movable part 120 and the drive beams 110a and 110b are disposed between the supporting units 140.

The movable part chip 104 includes, for example, a base body and the reflecting surface 14 on the +Z surface of the base body. The base body includes, for example, a silicon layer. The reflecting surface 14 includes a metal thin film containing, for example, aluminum (Al), gold (Au), or silver (Ag). The movable part 120 may have a reinforcing rib on the −Z surface of the base body for the reflection surface 14. While the reflecting surface 14 has a circular shape, the reflecting surface 14 may have another shape, such as an ellipse or a rectangle.

The drive beams 110a and 110b have two torsion bars 111a and 111b, the piezoelectric drive circuits 112a, 113a, 112b, and 113b. The torsion bars 111a and 111b that support the movable part 120 such that the movable part 120 is rotatable. One end of each of the two torsion bars 111a and 111b is coupled to the movable part 120 120, extends in the +X direction and the −X direction, and supports the movable part 120 such that the movable part 120 is rotatable. The piezoelectric drive circuits 112a and 113a are provided on a substrate coupled to the other end of the torsion bar 111a, and the piezoelectric drive circuits 112b and 113b are provided on a substrate coupled to the other end of the torsion bar 111b.

The torsion bars 111a and 111b include, for example, the silicon layer 163. The piezoelectric drive circuits 112a, 113a, 112b, and 113b each include a lower electrode 261, a piezoelectric circuit 262, and an upper electrode 263, which are formed in that order on the +Z surface of the silicon layer 163 that serves as an elastic member.

Each of the upper electrode 263 and the lower electrode 261 is made of, for example, gold (Au) or platinum (Pt). For example, the piezoelectric circuit 262 is made of lead zirconate titanate (PZT), which is a piezoelectric material.

Although this embodiment has illustrated an example in which the piezoelectric circuit 262 is formed on a surface (+Z surface) of the silicon layer 163 serving as the elastic member, the piezoelectric circuit 262 may be formed on another surface (for example, −Z surface) of the elastic member, or on both the surface and the other surface of the elastic member.

The shapes of the components are not limited to the shapes as long as the movable part 120 is rotatable about the R-axis. The torsion bars 111a and 111b, and the piezoelectric drive circuits 112a, 113a, 112b, and 113b may have shapes with curvatures.

The GND wires are connected to the upper electrode 263 of each of the piezoelectric drive circuits 112a, 113a, 112b, and 113b. Moreover, the voltage wires are connected to the lower electrode 261 of each of the piezoelectric drive circuits 112a and 112b, and applies a positive or negative drive voltage thereto.

In the movable part chip 104, the supporting unit 140 is not present on the ±Y sides of the movable part 120, which provides an opening. With this configuration, even when the deflection angle of the movable part 120 increases, the light reflected by the reflecting surface 14 is not blocked. Thus, the scanning angle with light of the movable part 120 is not limited, and a large scanning angle can be obtained.

Figure 5:
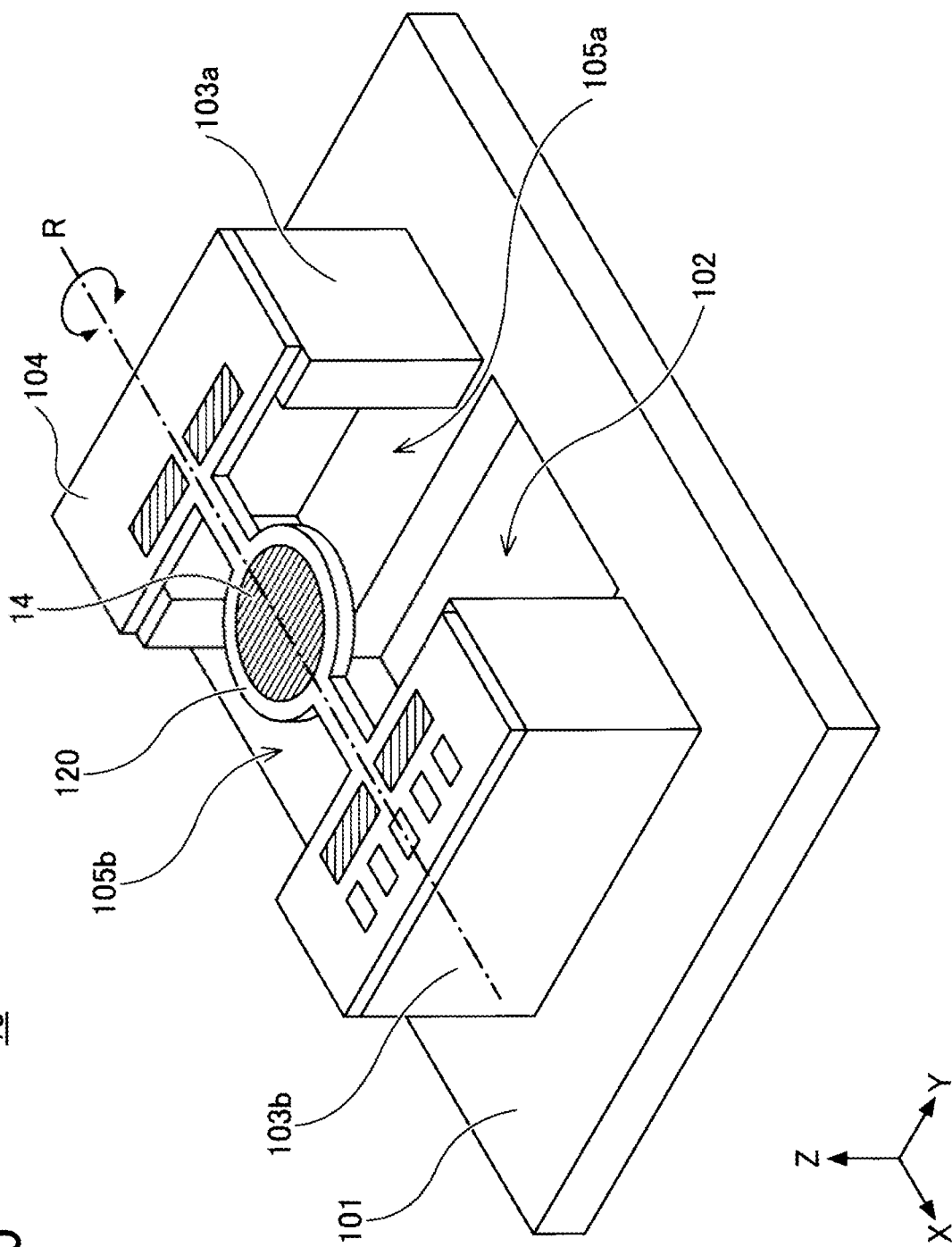
FIG. 5 is a perspective view of a movable device according to a first embodiment.

As illustrated in FIG. 5, the stationary part 103a has a cross section of an angular U shape parallel to the XY plane. The mounting board 101 is a plate-shaped member. The stationary part 103a is secured by, for example, bonding to the +Z surface of the mounting board 101 such that the open side of the angular U-shaped part faces in the +X direction. Similarly, the stationary part 103b has a cross section of an angular U shape parallel to the XY plane. The mounting board 101 is a plate-shaped member. The stationary part 103a is secured by, for example, bonding to the +Z surface of the mounting board 101 such that the open side of the angular U-shaped part faces in the −X direction.

The supporting unit 140 of the movable part chip 104 is secured onto the +Z top surfaces of the stationary parts 103a and 103b. The stationary parts 103a and 103b are spaced apart from each other in the X direction. The stationary parts 103a and 103b are formed from material such as ceramic, silicon, metal, or resin. The stationary parts 103a and 103b may be formed from the same material or may be formed from different materials. The movable part chip 104 and the stationary parts 103a and 103b may be formed as an integrated unit.

Figure 8:
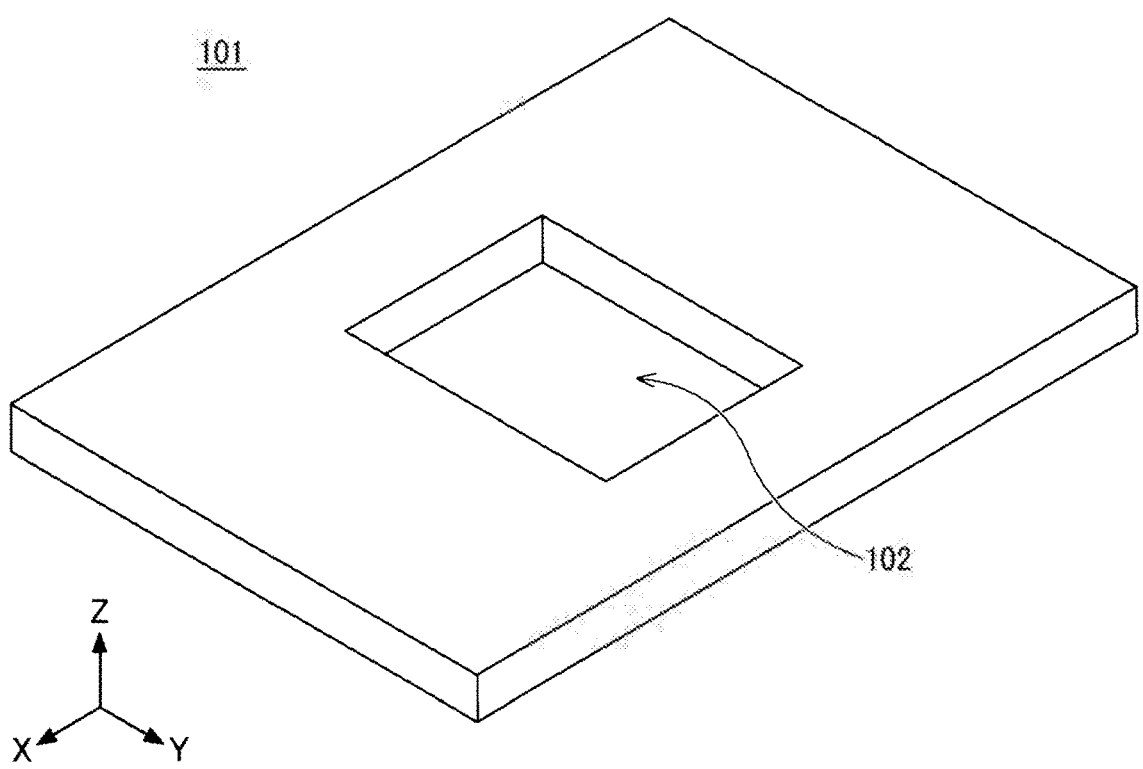
FIG. 8 is a perspective view of a mounting board of the movable device according to the first embodiment.

As illustrated in FIG. 8, the mounting board 101 is a substantially rectangular plate-shaped member and has a substantially rectangular through hole 102 in the central portion thereof. The mounting board 101 is, for example, a printed circuit board, and is specifically formed from glass epoxy, glass polyimide, glass composite, paper epoxy, or the like. The mounting board 101 may be made from glass, metal, or the like as long as the stationary parts 103a and 103b can be firmly bonded to the −Z surface. Further, the size of the through hole 102 is not particularly limited, but may be any size larger than a size that does not cause a collision when the movable part 120 rotates.

Figure 9:
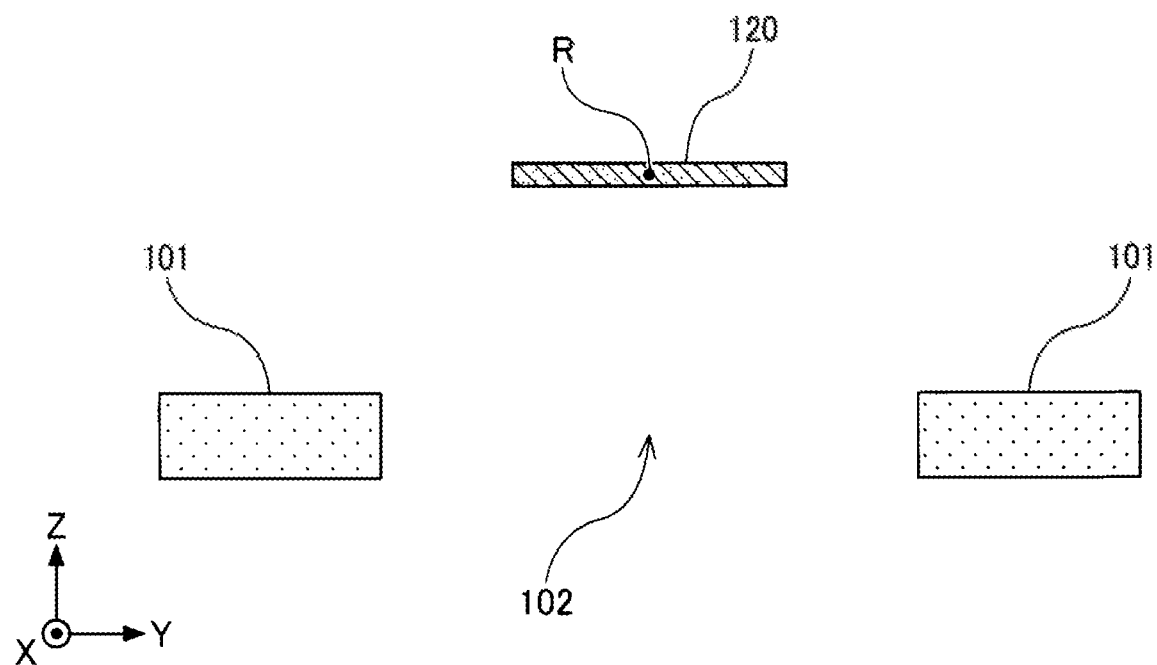
FIG. 9 is a cross-sectional view of the movable device according to the first embodiment.

FIG. 9 is a cross-sectional view taken along the YZ plane including the center of the movable part 120 of the movable part chip 104 in FIG. 5. In the movable device of the present embodiment, the stationary parts 103a and 103b are apart from each other below the movable part 120, that is, on the −Z side of the movable part 120, which forms a space. Below the space, the through hole 102 is provided in the mounting board 101. This arrangement enables an airflow generated by the rotation of the movable part 120 about the R-axis to flow through the through hole 102. This reduces the possibility of an air-pressure difference and prevents generation of turbulent airflow. In the present embodiment, turbulent airflow is prevented from being generated. Such a configuration enables the movable part 120 to rotate in a desired manner without affecting the rotation of the movable part 120, which achieves a stable and accurate rotation of the movable part 120.

When the movable device of the present embodiment is applied to an image forming apparatus, the movable part 120 provided with the reflecting surface 14 of the movable part chip 104 rotates while performing galvano scanning so as to form an image.

A method of manufacturing a movable device of an embodiment is described.

As illustrated in FIG. 8, the mounting board 101 having a through hole 102 is first prepared.

Figure 10:
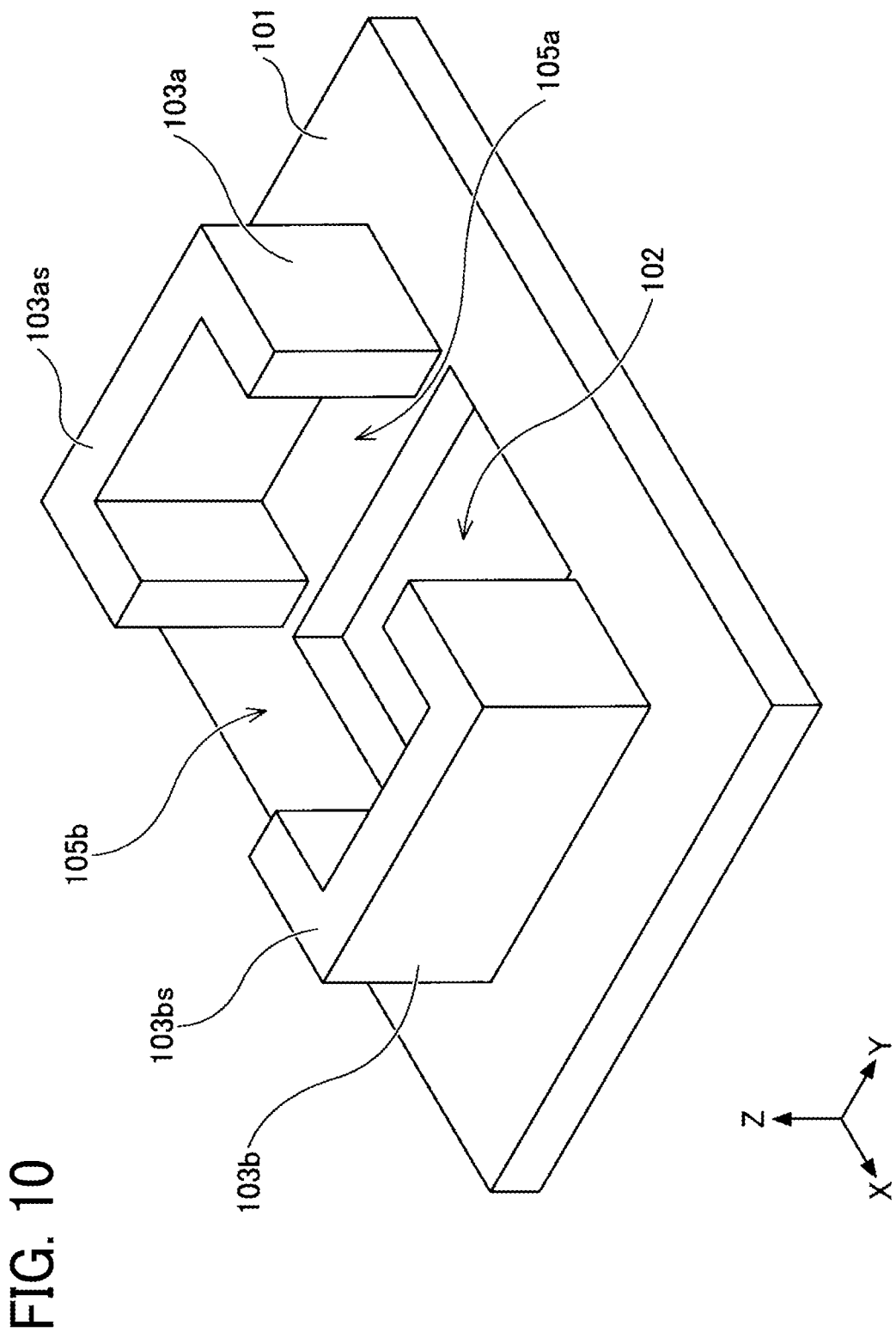
FIG. 10 is an illustration for describing a method of producing the movable device according to the first embodiment.

Next, as illustrated in FIG. 10, the stationary parts 103a and 103b are bonded to a predetermined position of the +Z surface of the mounting board 101. The stationary parts 103a and 103b are preferably processed to have good flatness so that an upper surface 103as and an upper surface 103bs, which are the +Z surfaces, lie on the same plane parallel to the XY plane.

Next, the movable part chip 104 is bonded to the upper surface 103as of the stationary part 103a and the upper surface 103bs of the stationary part 103b with, for example, adhesive. As a result, as illustrated in FIG. 5, the movable device 13 of the present embodiment is manufactured.

Next, a movable device according to a second embodiment is described. The movable device according to the present embodiment has a structure in which a part of the bottom of the mount is cut away to form a connecting part that connects two stationary parts. This structure is more insusceptible to turbulent airflow than the structure of the mount with a full bottom surface. The movable device according to the first embodiment includes two separate stationary parts 103a and 103b, which support the movable part chip 104. This arrangement makes it technically difficult to process the upper surface 103as of the stationary part 103a and upper surface 103bs of the stationary part 103b such that the upper surface 103as and the upper surface 103bs lie on the same plane. If the upper surface 103as of the stationary part 103a and the upper surface 103bs of the stationary part 103b fail to lie on the same plane, the supporting unit 140 supporting the both side of the movable part 120 fails to be disposed on the upper surface 103as and the upper surface 103bs in a horizontal manner. This applies external force to the drive beams 110a and 110b between the movable part 120 and the connecting portion, which might adversely affects the resonance frequency of the movable part 120.

In the movable device according to the present embodiment, the upper surfaces of the two stationary parts are formed to lie on the same plane. This configuration provides a stable rotation of the movable part while reducing the effects on the resonance frequency of the movable part 120.

Figure 11:
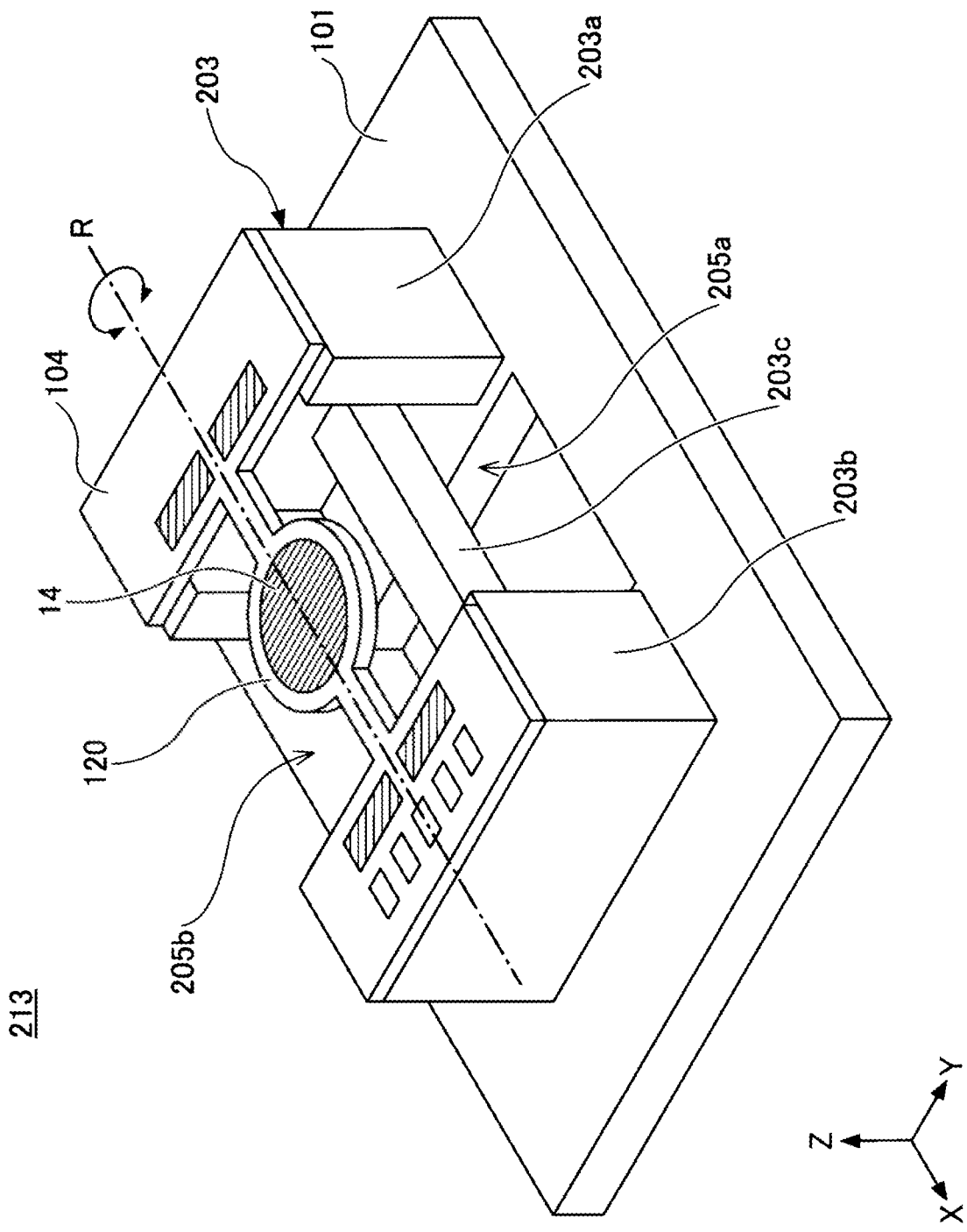
FIG. 11 is a perspective view of a movable device according to a second embodiment.
Figure 12:
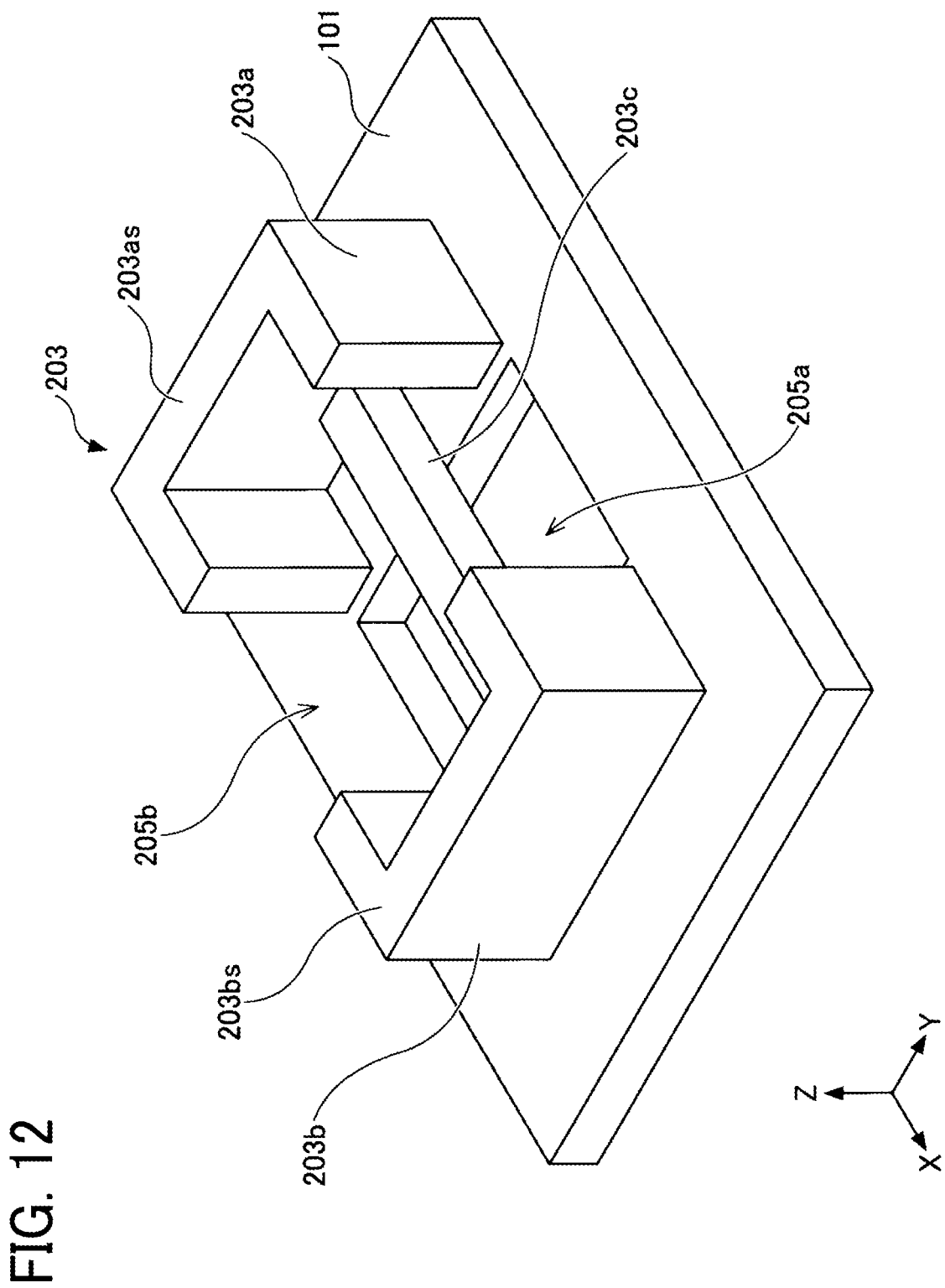
FIG. 12 is an illustration of the movable device according to the second embodiment.

A movable device 213 according to an embodiment is described with reference to FIGS. 11 and 12. FIG. 11 is a perspective view of the movable device 213 according to the present embodiment, and FIG. 12 is an illustration of a mount 203 bonded to the mounting board 101, according to the present embodiment.

In the present embodiment, the mount 203 includes a stationary parts 203a and 203b, and a connecting part 203c at the substantially central portion of the mounting board 101. The connecting part 203c connects the stationary part 203a and the stationary part 203b. The longitudinal direction of the connecting part 203c is along the R-axis, that is, in the X direction. In other words, the longitudinal direction of the connecting part 203c is parallel to the R-axis. In the movable device 213 according to the present embodiment as illustrated in FIG. 12, the mount 203 is bonded to the +Z surface of the mounting board 101, and a movable part chip 104 is bonded to the upper surfaces 203as and 203bs on the +Z side of the stationary parts 203a and 203b of the mount 203. The connecting part 203c has a structure in which a predetermined area is cut away from the bottom having the stationary parts 203a and 203b on a predetermined surface so as to have the width in the Y direction narrower than the stationary parts 203a and 203b. In other words, the connecting part 203c is insusceptible to turbulent airflow when a part of the bottom of the mount 203 is cut away, unlike when the bottom is not partly cut away.

The mount 203 is a single integrated unit formed by combining the stationary parts 203a and 203b and the connecting part 203c. This enables the upper surfaces 203as and 203bs on the +Z side of the stationary parts 203a and 203b, respectively to lie on the same plane parallel to the XY plane. This configuration prevents the adverse effects on the rotation of the movable part 120 without causing the deformation of the bonding portion where the movable part chip 104 is bonded to with, for example, adhesive to the +Z side upper surfaces 203as and 203bs of the stationary parts 203a and 203b.

The stationary parts 203a and 203b are a pair, and a space is provided between the stationary parts 203a and 203b bonded to the mounting board 101. This space forms passthrough areas 205a and 205b through which light reflected by the reflecting surface 14 passes when the movable part 120 is rotated about the R-axis. The light reflected by the reflecting surface 14 is along a direction orthogonal to the R-axis. The width of the connecting part 203c in the Y direction is narrower than the width of the stationary parts 203a and 203b in the Y direction. In other words, the width of the connecting part 203c in the direction orthogonal to the R-axis is smaller than the width of the stationary parts 203a and 203b in the direction orthogonal to the R-axis. Unlike when the width of the connecting part 203c, which connects the stationary part 203a and the stationary part 203b, in the direction orthogonal to the R-axis (i.e., the Y direction) is larger than or equal to the width of the stationary parts 203a and 203b in the direction orthogonal to the R-axis (i.e., the Y direction), the mount 203 according to the present embodiment enables the movable part 120 to rotate without any trouble caused by turbulent airflow and achieves a stable rotation of the movable part 120.

The mount 203 is formed from a material such as ceramic, silicon, metal, or resin, and the stationary parts 203a and 203b, and the connecting part 203c may be formed from the same material or different materials. As a method of forming the stationary parts 203a and 203b and the connecting part 203c with the same material, there is a method of manufacturing the stationary parts 203a and 203b and the connecting part 203c individually and then bonding the manufactured stationary parts 203a and 203b and connecting part 203c together to form the mount 203. Alternatively, a method of cutting one member or manufacturing by injection molding may be applied. As a method of forming the stationary parts 203a and 203b and the connecting part 203c with different materials, there is a method of manufacturing the stationary parts 203a and 203b and the connecting part 203c individually and then bonding the manufactured stationary parts 203a and 203b and connecting part 203c together to form the mount 203.

At the final stage of the manufacturing process of the mount 203, the upper surface 203as of the stationary part 203a and the upper surface 203bs of the stationary part 203b are simultaneously polished, so that the upper surface 203as of the stationary part 203a and the upper surface 203bs of the stationary part 203b can lie on the same plane.

Next, a method of manufacturing a movable device is described with reference to FIGS. 13(a), (b), and (d).

Figure 13:
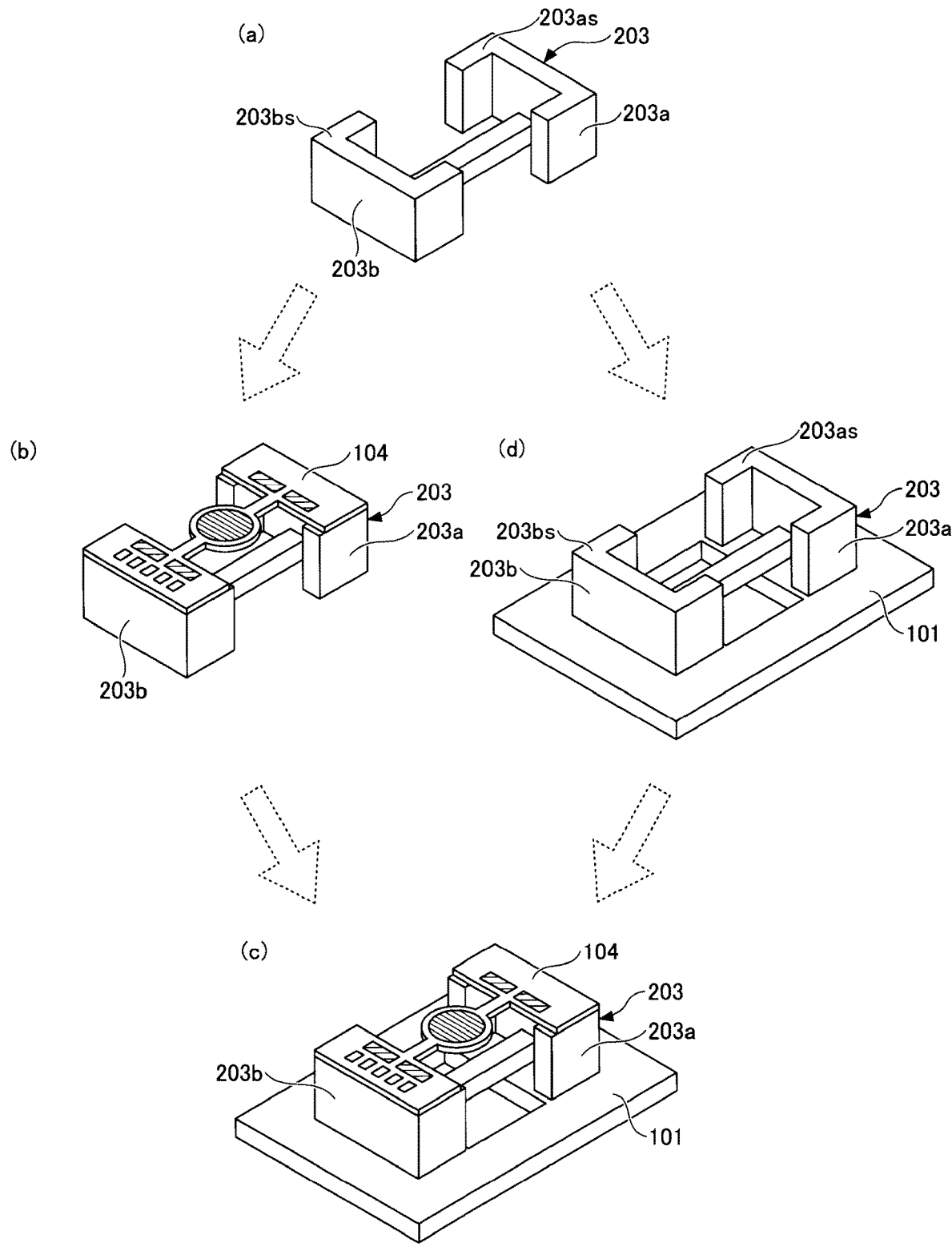
FIG. 13(13(a), 13(b), 13(c), 13(d)) is an illustration for describing the process of manufacturing the movable device according to the second embodiment.

First, as shown in FIG. 13(a), a mount 203 is prepared.

Next, as illustrated in FIG. 13(b), the movable part chip 104 is bonded to the upper surfaces 203as and 203bs of the stationary parts 203a and 203b of a mount 203 with, for example, adhesive.

Next, as illustrated in FIG. 13(c), the mount 203 is bonded to a predetermined position of the upper surface of the mounting board 101. As a result, the movable device of the present embodiment is manufactured.

As another manufacturing method, a mount 203 is first prepared as illustrated in FIG. 13(a).

Next, as illustrated in FIG. 13(d), the mount 203 is bonded to a predetermined position of the upper surface of the mounting board 101.

Next, as illustrated in FIG. 13(c), the movable part chip 104 is bonded to the upper surfaces 203as and 203bs of the stationary parts 203a and 203b of the mount 203 with, for example, adhesive. As a result, the movable device of the present embodiment is manufactured.

Figure 14:
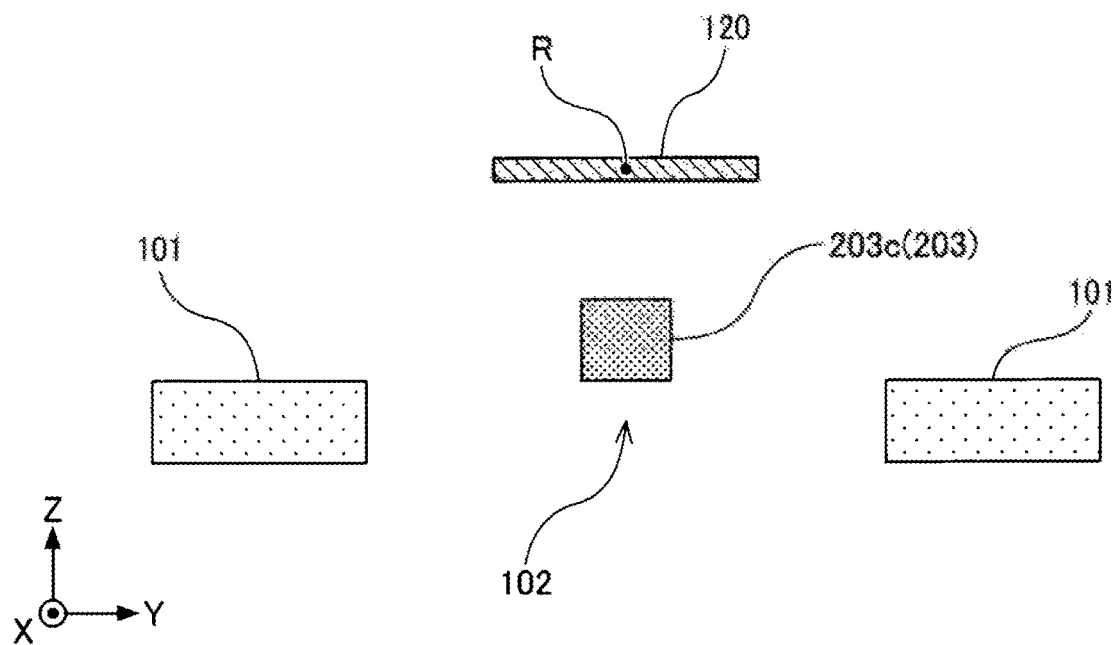
FIG. 14 is a cross-sectional view of the movable device according to the second embodiment.

FIG. 14 is a cross-sectional view taken along the YZ plane including the center of the movable part 120 of the movable part chip 104 in FIG. 11. In the present embodiment, he connecting part 203c of the mount 203 is present below the movable part 120, that is, on the −Z side of the movable part 120. The through hole 102 in the mounting board 101 is sufficiently wider than the connecting part 203c in the Y direction. This arrangement enables an airflow generated by the rotation of the movable part 120 about the R-axis to flow through the through hole 102. This reduces the possibility of an air-pressure difference and prevents generation of turbulent airflow.

Figure 15:
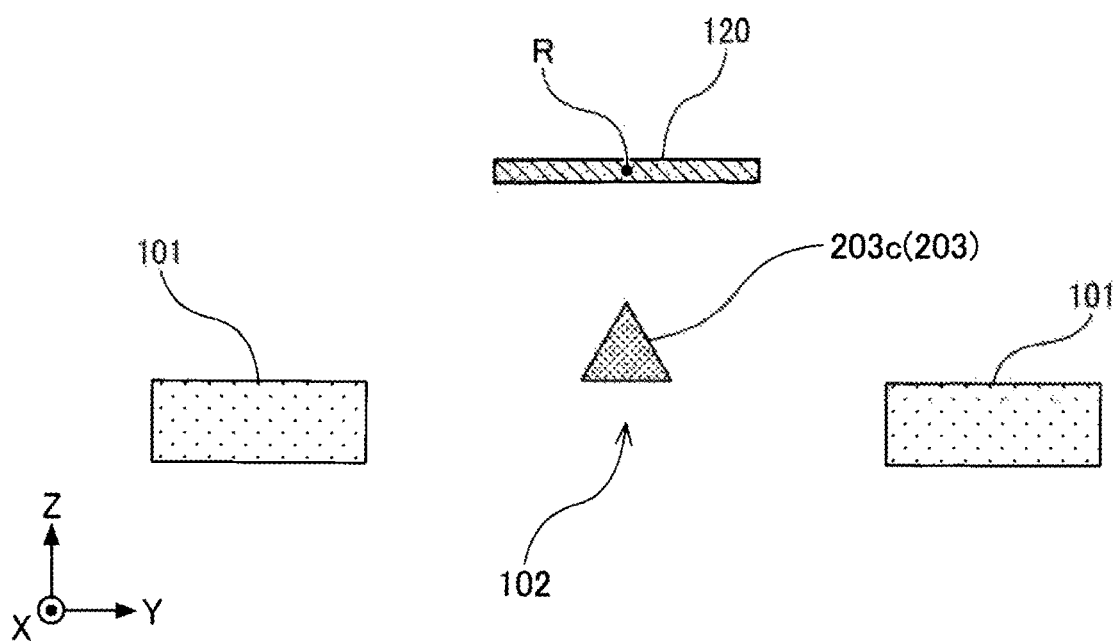
FIG. 15 is a cross-sectional view of a movable device according to a first modification of the second embodiment.
Figure 16:
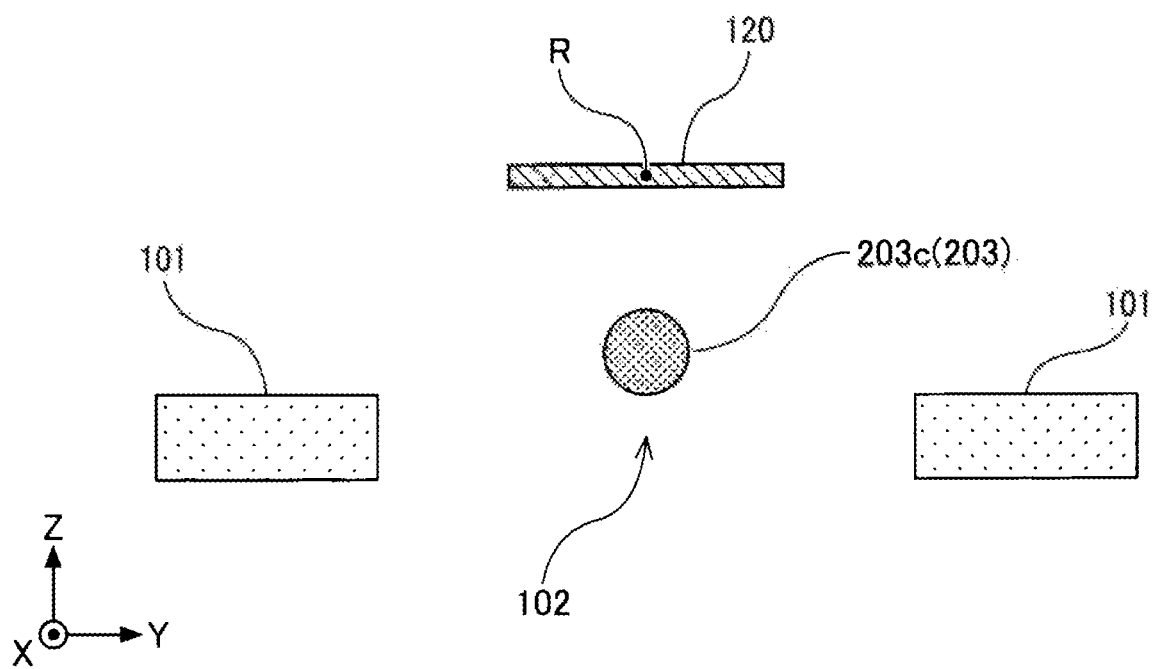
FIG. 16 is a cross-sectional view of a movable device according to a second modification of the second embodiment.

In the above description, the case where the cross section parallel to the YZ plane of the connecting part 203c in the mount 203 is a quadrangle has been described. In some examples, the cross section of the connecting part 203c may be triangular as illustrated in FIG. 15 or may be circular as illustrated in FIG. 16. In some other examples, the cross section of the connecting part 203c may be a trapezoid in which the upper base is narrower than the lower base. Other examples of the cross-sectional shape of the connecting part 203c may include an H-shape, a U-shape, a V-shape, and an X-shape to increase the rigidity of the connecting part 203c.

Further, the drive device (the drive beams) according to an embodiment may be provided with a drive beam in which a plurality of cantilever portions are connected to form a meander structure, instead of the drive beams 110a and 110b that rotationally drive the movable part 120.

Figure 17:
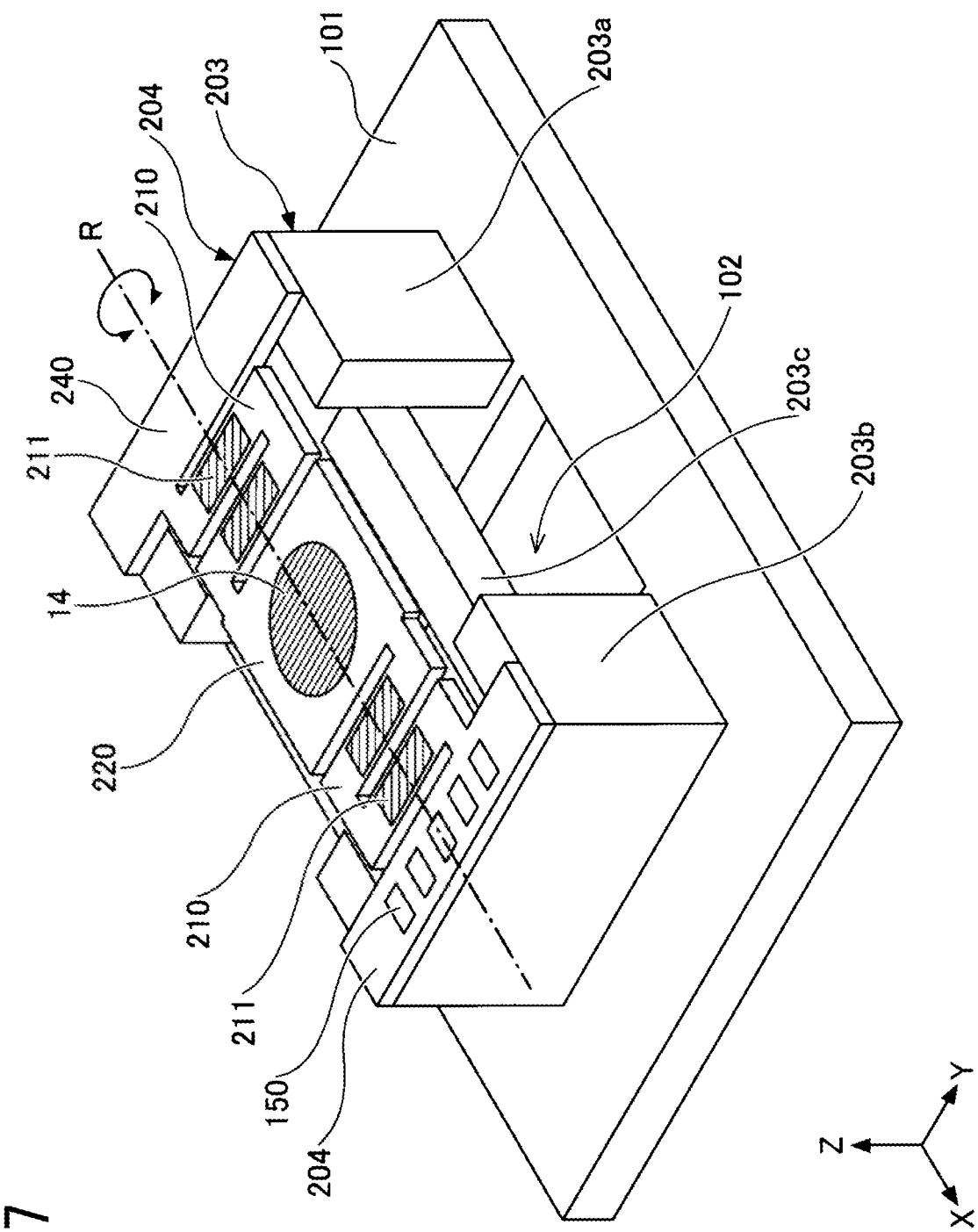
FIG. 17 is a cross-sectional view of a movable device according to a third modification of the second embodiment.

In the example of FIG. 17, the movable part chip 204 includes a movable part 220 of a substantially rectangular shape and having the reflecting surface 14. The drive beams 210, which support the movable part 220 such that the movable part 220 is rotatable, are provided on the both sides of the movable part 220 in the X direction, respectively. The drive beam 210 has a meander structure in which a plurality of cantilevers is connected, and a piezoelectric drive circuit 211 is provided on each cantilever. One end of the drive beam 210 is coupled to the movable part 220, and the other end of the drive beam 210 is coupled to a supporting unit 240. The supporting unit 240 has two separate parts on the +X side and the −X side, and the electrode connecting part 150 is provided on the +X-side supporting unit 240. In the modified example of FIG. 17, the supporting unit 240 of the movable part chip 204 is bonded to the upper surfaces of the stationary parts 203a and 203b of the mount 203.

Figure 18:
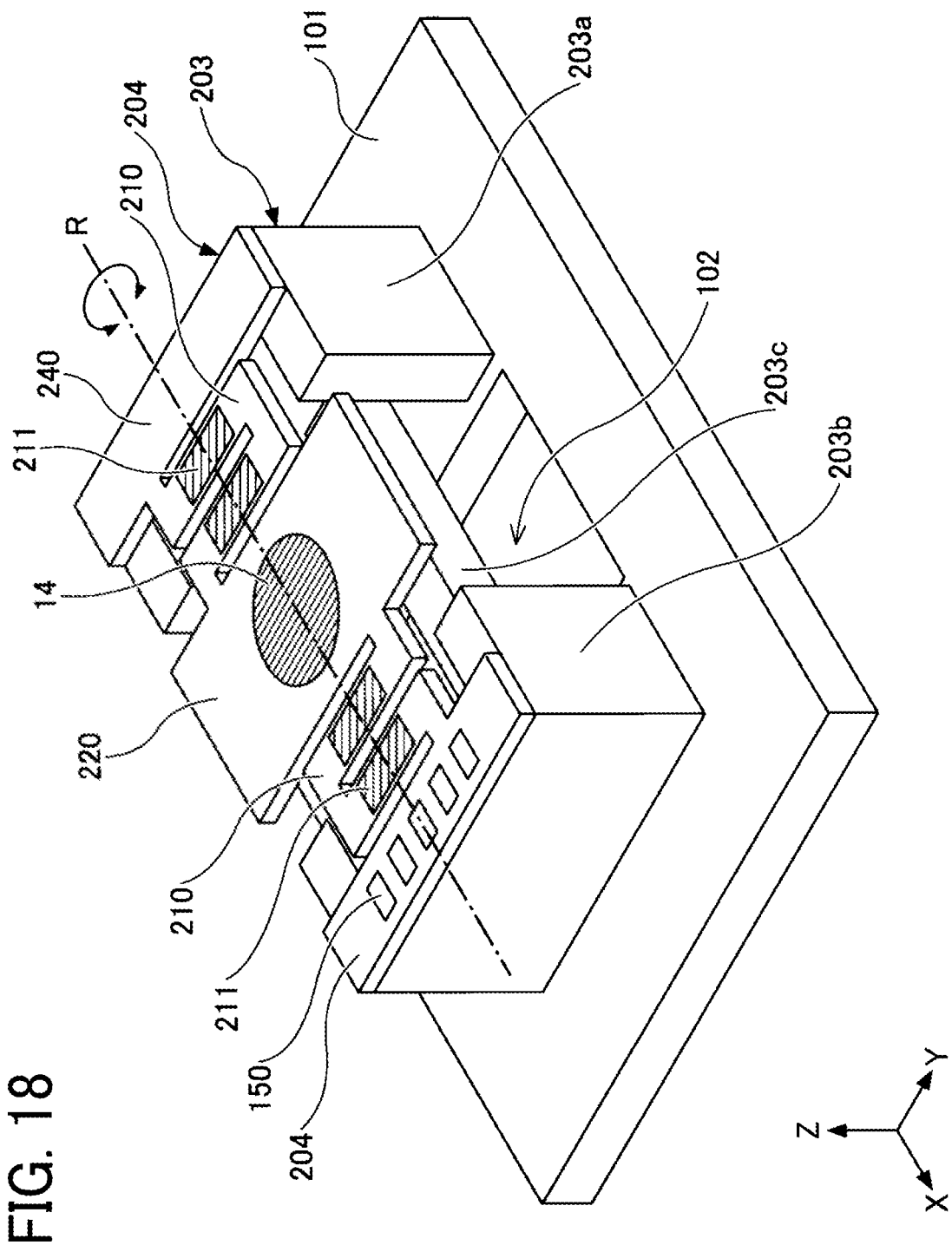
FIG. 18 is a cross-sectional view of a movable device according to a fourth modification of the second embodiment.

In this modification, the shape and size of the movable part 220 are not particularly limited. As illustrated in FIG. 18, the length of movable part 220 in the Y direction may be the same as the length of the movable part chip 204 in the Y direction. In another example, the length of movable part 220 in the Y direction may be longer than the length of the movable part chip 204 in the Y direction.

Figure 19:
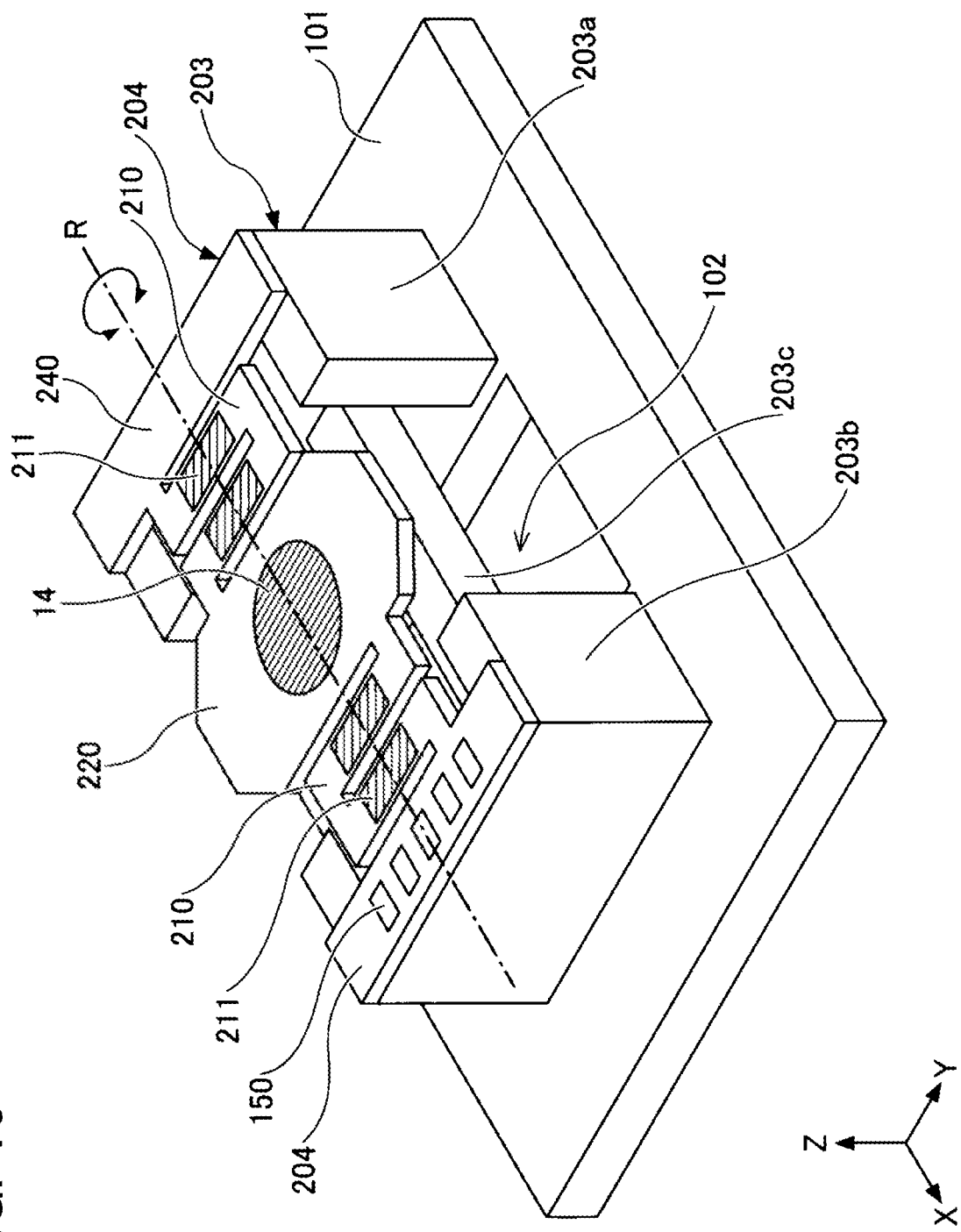
FIG. 19 is a cross-sectional view of a movable device according to a fifth modification of the second embodiment.

As illustrated in FIG. 19, the movable part 220 may have an octagonal shape. The movable part 220 may have a shape symmetrical about the rotation axis, such as a circle, an elliptical shape, and a hexagon.

The characteristic features other than those described above are the same as those in the first embodiment.

Next, a movable device according to a third embodiment is described. The mount of the movable device incudes one connecting part in the second embodiment, whereas two connecting parts are provided in the mount of the movable device to improve rigidity and strength.

Figure 20:
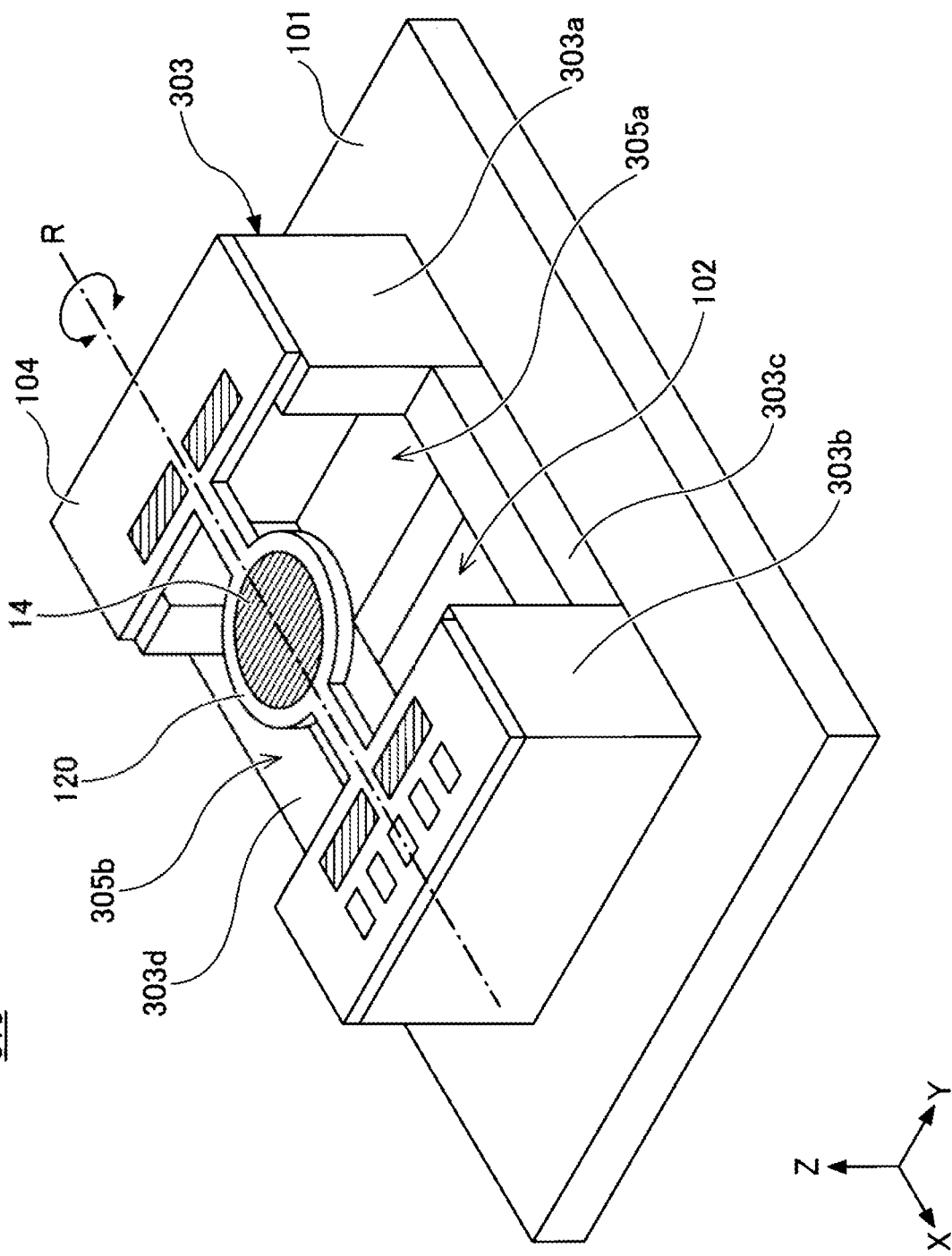
FIG. 20 is a perspective view of a movable device according to a third embodiment.
Figure 21:
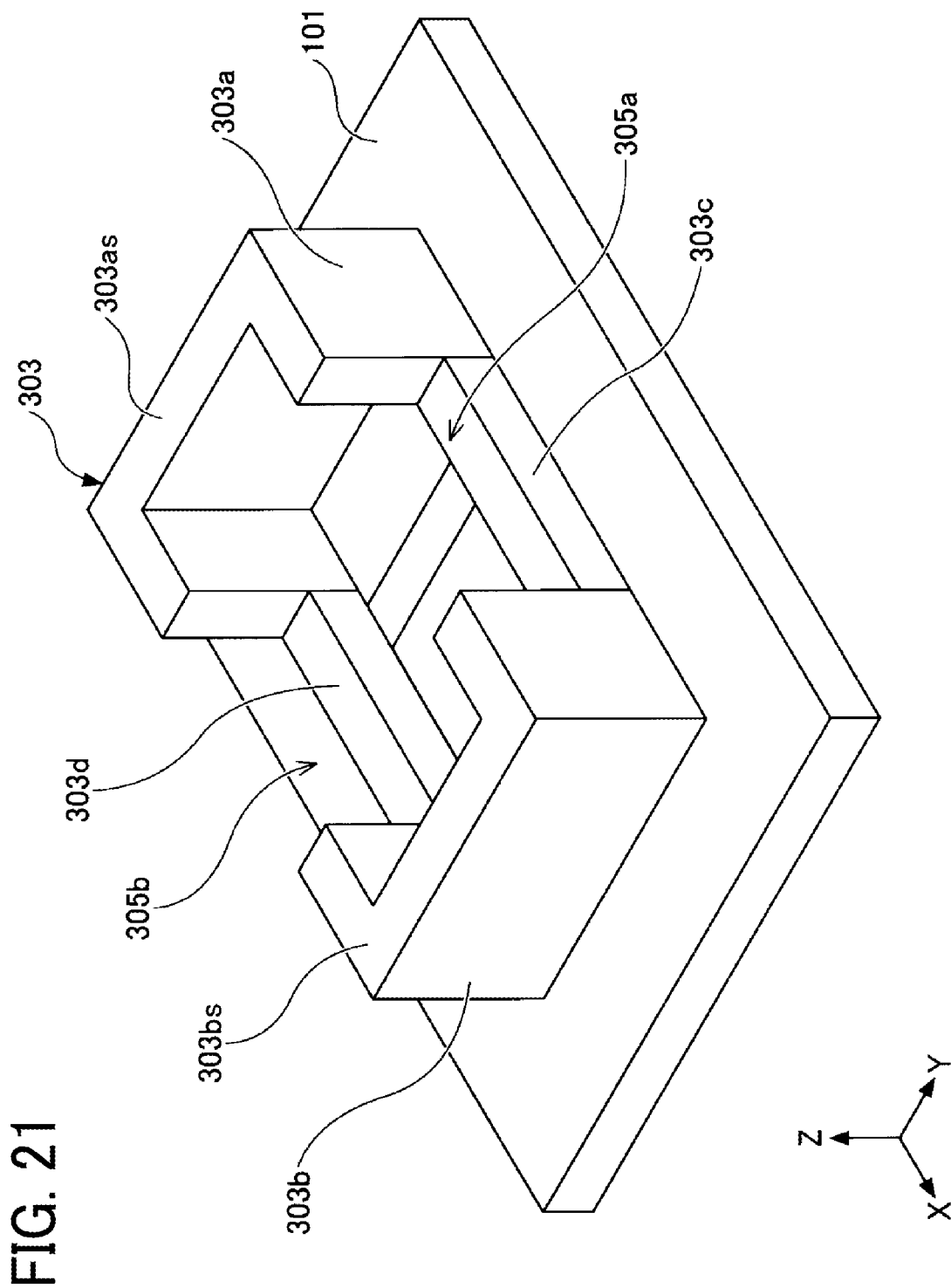
FIG. 21 is an illustration of the movable device according to the third embodiment.

A movable device 313 according to the present embodiment is described with reference to FIGS. 20 and 21. FIG. 20 is a perspective view of the movable device 313 according to the present embodiment, and FIG. 21 is an illustration of a mount 303 boned to the mounting board 101, according to the present embodiment.

In the movable device 313 according to the present embodiment, the mount 303 is bonded to the +Z surface of the mounting board 101, and the movable part chip 104 is bonded to the +Z upper surfaces 303as and 303bs of the stationary parts 303a and 303b of the mount 303. The stationary parts 303a and 303b are a pair of stationary parts, and a space is provided between the stationary parts 303a and 303b bonded to the mounting board 101. This space allows light reflected by the reflecting surface 14 to pass therethrough when the movable part 120 rotates.

The mount 303 includes the stationary parts 303a and 303b and the connecting parts 303c and 303d connecting the stationary part 303a and the stationary part 303b. The mount 303 is a single integrated unit formed by combining the stationary parts 303a and 303b and the connecting parts 303c and 303d. This configuration enables the upper surface 303as on the +Z side of the stationary part 303a and the upper surface 303bs on the +Z side of the stationary part 303b to lie on the same plane parallel to the XY plane. This configuration prevents the adverse effects on the resonance frequency of the movable part 120 without causing the deformation of the bonding portion where the movable part chip 104 is bonded to with, for example, adhesive to the +Z upper surfaces 303as and 303bs of the stationary parts 303a and 303b.

The +Y ends of the stationary parts 303a and 303b are connected by the connecting part 303c, and the −Y ends of the stationary parts 303a and 303b are connected by the connecting part 303d. This arrangement increases the rigidity and strength of the mount 303 more than the case where the mount is provided with a single connecting part. The width of the connecting parts 303c and 303d in the Y direction is narrower than the width of the stationary parts 303a and 303b in the Y direction. In other words, the width of the connecting parts 303c and 303d in the direction orthogonal to the R-axis is smaller than the width of the stationary parts 303a and 303b in the direction orthogonal to the R-axis.

The mount 303 is formed from a material such as ceramic, silicon, metal, or resin, and the stationary parts 303a and 303b, and the connecting parts 303c and 303d may be formed from the same material or different materials.

At the final stage of the manufacturing process of the mount 303, the upper surface 303as of the stationary part 303a and the upper surface 303bs of the stationary part 303b are simultaneously polished, so that the upper surface 303as of the stationary part 303a and the upper surface 303bs of the stationary part 303b can lie on the same plane.

Figure 22:
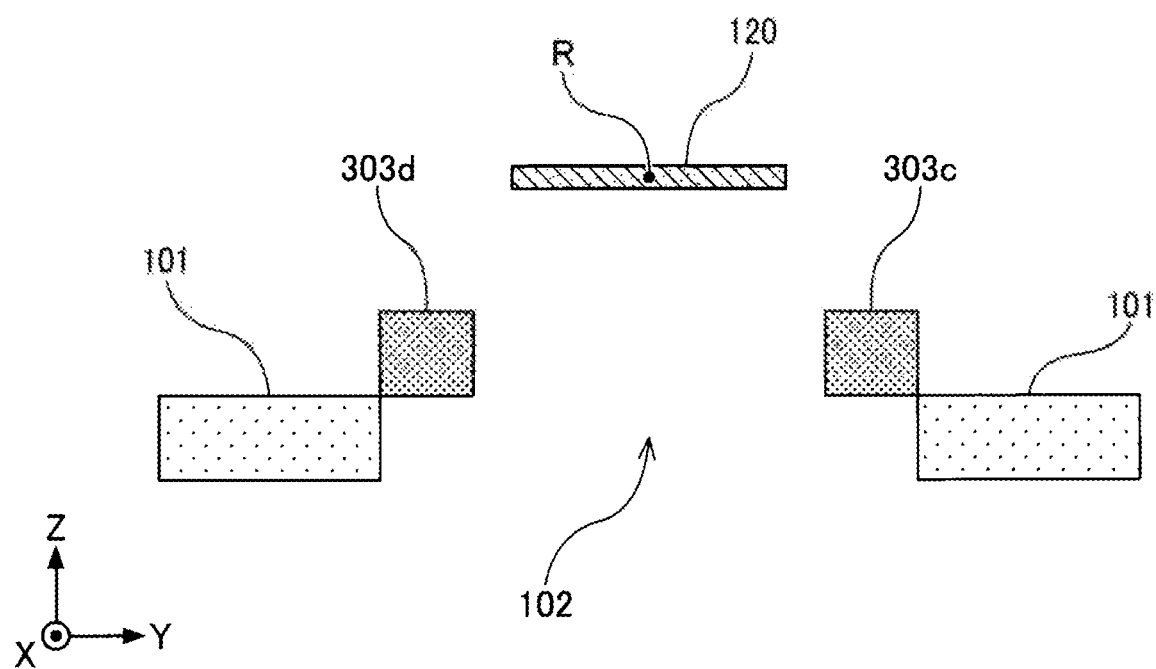
FIG. 22 is a cross-sectional view of the movable device according to the third embodiment.

FIG. 22 is a cross-sectional view taken along the YZ plane including the center of the movable part 120 of the movable part chip 104 in FIG. 20. In the present embodiment, the connecting parts 303c and 303d of the mount 303 are present below the movable part 120, that is, on the −Z side of the movable part 120. Although a part of the through hole 102 in the mounting board 101 is blocked by the connecting parts 303c and 303d, an opening is sufficiently provided. This arrangement enables an airflow generated by the rotation of the movable part 120 about the R-axis to flow through the through hole 102. This reduces the possibility of an air-pressure difference and prevents generation of turbulent airflow. Such a configuration enables the movable part 120 to rotate in a desired manner without being affected by turbulent airflow, which achieves a stable and accurate rotation of the movable part 120.

In the example of FIG. 22, the connecting parts 303c and 303d of the mount 303 partly block the +Y side and the −Y side of the through hole 102 of the mounting board 101. The present disclosure is not limited to this configuration. In another example, the through hole 102 of the mounting board 101 may be further widened to form the connecting parts 303c and 303d floating above the through hole 102. In still another example, a space between the connecting part 303c and the connecting part 303d of the mount 303 is wider than the through hole 102 of the mounting board 101.

The characteristic features other than those described above are the same as those in the second embodiment.

Next, a movable device according to a fourth embodiment is described. The movable device according to the present embodiment has a structure in which an open region is provided in a part of the mounting unit.

Figure 23:
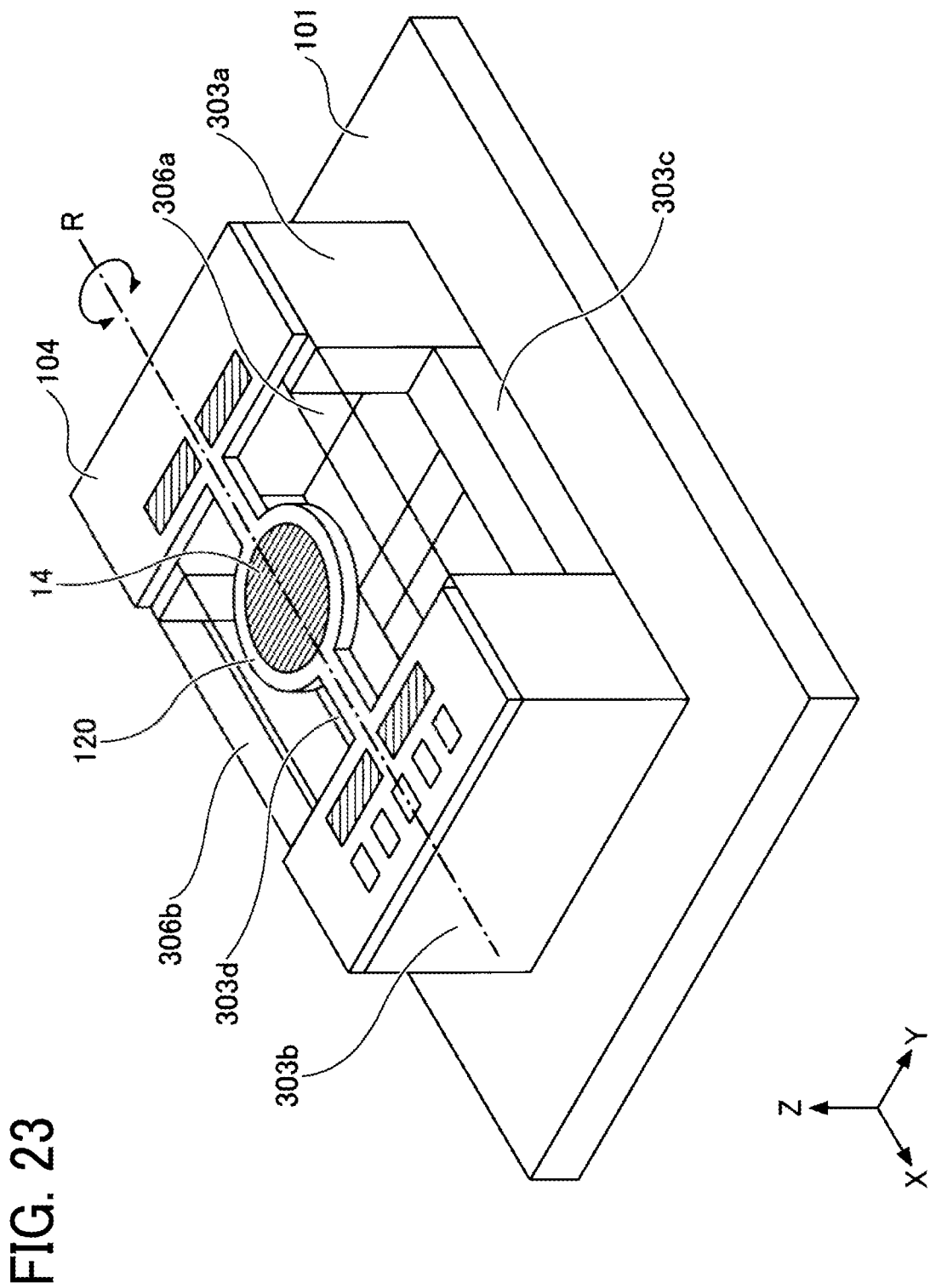
FIG. 23 is a perspective view of a movable device according to a fourth embodiment.

Specifically, as illustrated in FIG. 23, an open region 306a is provided on the connecting part 303c, that is, on the +Z side, and an open region 306b is provided on the connecting part 303d, that is, on the +Z side of the mount 303 of the movable device according to the third embodiment.

The open regions 306a and 306b are each formed from transparent glass and serve as a transparent area through which light is transmitted, so that the light reflected by the reflecting surface 14 of the movable part 120 is not blocked. Providing the open regions 306a and 306b enables the stationary part 303a and the stationary part 303b to be coupled more firmly, which increases structural rigidity and strength, unlike the configuration in which the mount 303 is provided with the connecting part 303c and the connecting part 303d without the open regions. The open regions 306a and 306b enables light reflected by the reflecting surface 14 to be transmitted therethrough when the movable part 120 rotates. The open regions may be an air gap where any element does not exit, or may include a member that transmits light, such as glass, at at least a part of such an air gap. In one example, the open regions 306a and 306b each have a tapered shape in which the width parallel with the E axis increases with an increase in the distance from the E-axis.

Figure 24:
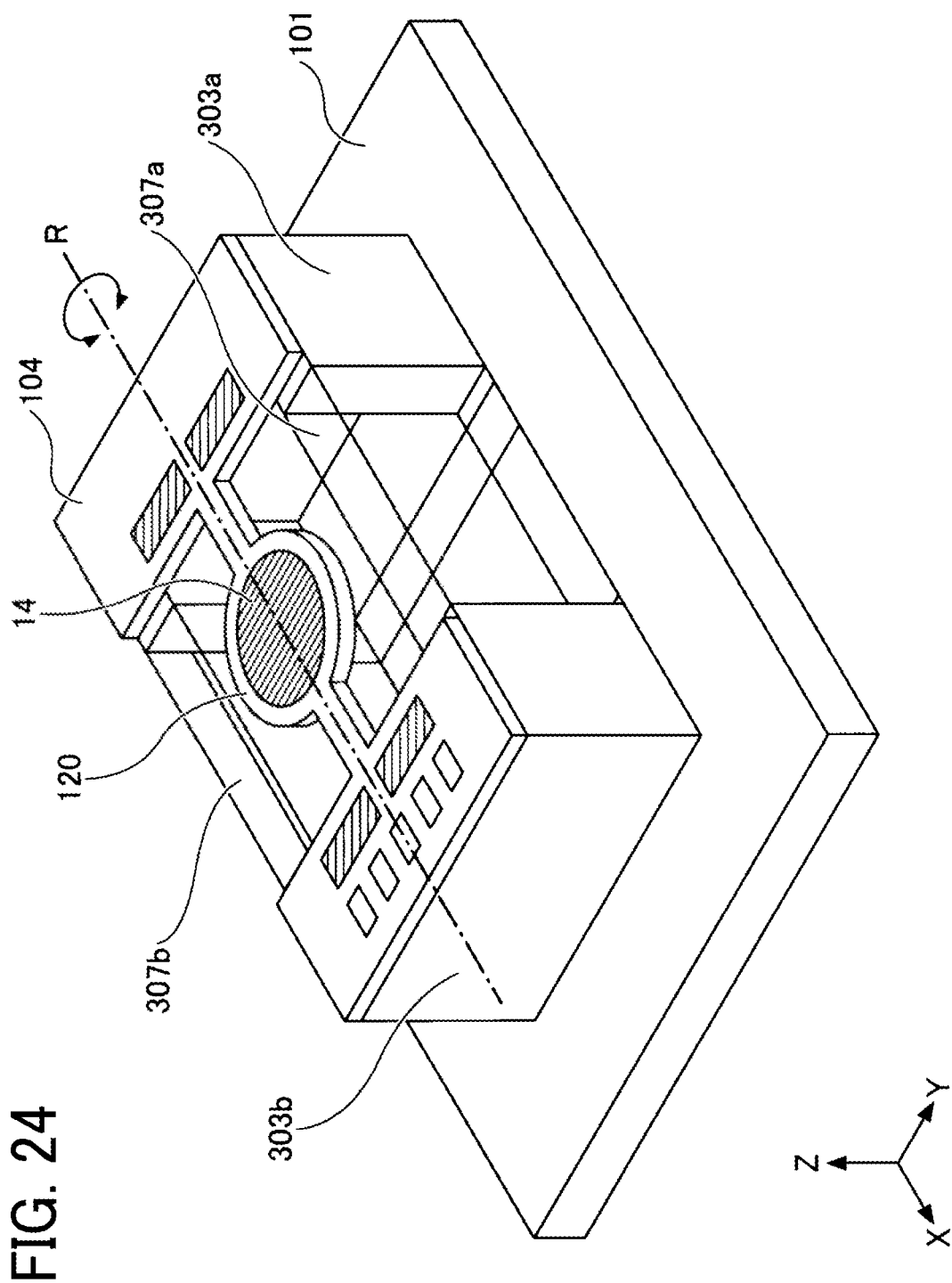
FIG. 24 is a perspective view of a movable device according to a modification of the fourth embodiment.

The movable device according to an embodiment as illustrated in FIG. 24 is provided with open regions 307a and 307b without the connecting parts 303c and 303c in the mount 303. Accordingly, the stationary parts 303a and 303b are disposed with the open regions 307a and 307b therebetween.

The characteristic features other than those described above are the same as those in the third embodiment.

The movable device according to the embodiments described above is applicable in an optical deflection system, an optical scanning system, an image projection apparatus, an optical writing device, and a distance measurement device.

With initially reference to FIGS. 25 to 28, an optical scanning system to which a movable device according to an embodiment of the present disclosure is applied is described below in detail.

Figure 25:
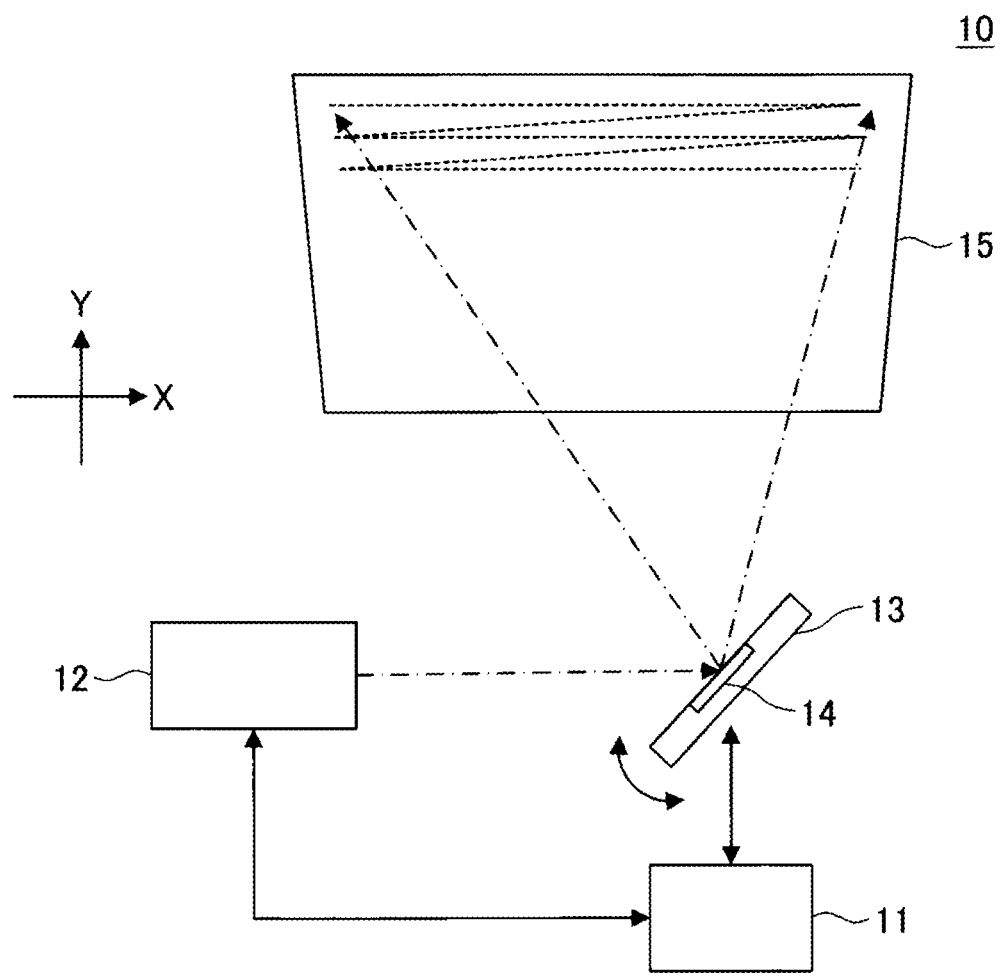
FIG. 25 is a schematic view of an example of an optical scanning system.

FIG. 25 is a schematic view of an example of an optical scanning system 10. As illustrated in FIG. 25, the optical scanning system 10 deflects light emitted from a light-source device 12 under the control of a control device 11, by using a reflecting surface 14 included in the movable device 13, so as to optically scan a target surface 15 to be scanned (hereinafter, referred to as target surface).

The optical scanning system 10 includes the control device 11, the light-source device 12, and the movable device 13 including the reflecting surface 14.

The control device 11 is, for example, an electronic circuit unit including, for example, a central processing unit (CPU) and a field-programmable gate array (FPGA). The movable device 13 is, for example, a micro electro mechanical systems (MEMS) device that includes a reflecting surface 14 and that can move the reflecting surface 14. The light-source device 12 is, for example, a laser device that emits a laser beam. The target surface 15 is, for example, a screen.

The control device 11 generates control instructions of the light-source device 12 and the movable device 13 based on acquired optical-scanning information, and outputs drive signals to the light-source device 12 and the movable device 13 based on the control instructions.

The light-source device 12 emits light based on the received drive signal. The movable device 13 moves the reflecting surface 14 in at least one of a uniaxial direction and a biaxial direction, based on the received drive signal.

With this configuration, for example, the reflecting surface 14 of the movable device 13 is biaxially moved in a reciprocating manner within a predetermined range, and the light emitted from the light-source device 12 to be incident on the reflecting surface 14 is uniaxially deflected to perform optical scanning, under the control of the control device 11, which is based on image data that is an example of the optical-scanning information. Accordingly, an image can be projected onto the target surface 15 as desired. The details of the movable device and the details of the control of the control device according to the embodiment are described later.

Figure 26:
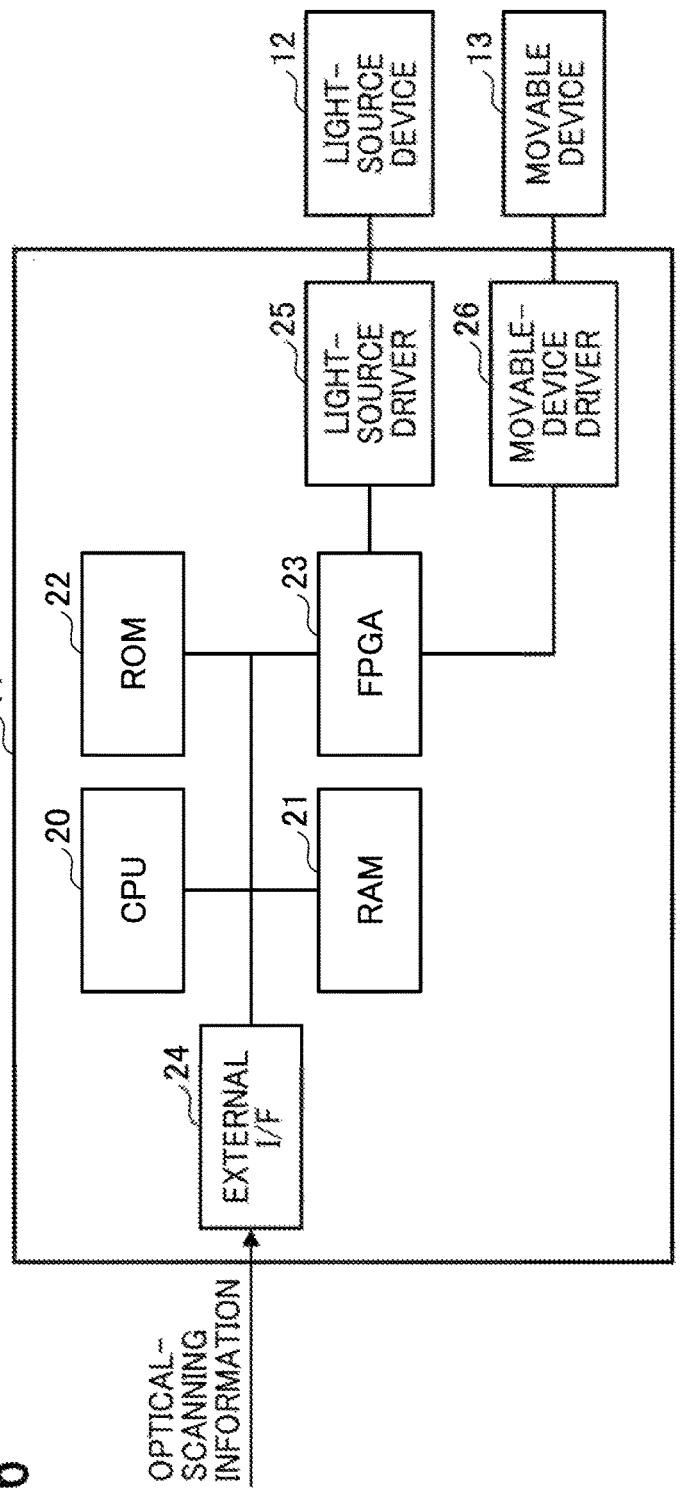
FIG. 26 is a hardware block diagram of the optical scanning system according to an embodiment of the present disclosure.

Next, the hardware configuration of an example of the optical scanning system 10 is described referring to FIG. 26. FIG. 26 is a hardware block diagram of the optical scanning system 10 according to an embodiment of the present disclosure. As illustrated in FIG. 26, the optical scanning system 10 includes the control device 11, the light-source device 12, and the movable device 13, which are electrically connected to one another. The control device 11 includes a CPU 20, a random access memory (RAM) 21, a read only memory (ROM) 22, a FPGA 23, an external interface (I/F) 24, a light-source driver 25, and a movable-device driver 26.

The CPU 20 is an arithmetic device that loads into the RAM 21 a program or data from a storage device such as the ROM 22 and executes processing to provide the controls or functions of the entirety of the control device 11.

The RAM 21 is a volatile storage device that temporarily stores a program and data.

The ROM 22 is a non-volatile storage device that can store programs and data even after the power is turned off, and stores processing programs and data that the CPU 20 executes to control each function of the optical scanning system 10.

The FPGA 23 is a circuit that outputs proper control signals to the light-source driver 25 and the movable-device driver 26 in accordance with the processing performed by the CPU 20.

For example, the external I/F 24 is an interface with respect to an external device or a network. The external device may be, for example, a host device such as a personal computer (PC); or a storage device, such as a universal serial bus (USB) memory, a secure digital (SD) card, a compact disk (CD), a digital versatile disk (DVD), a hard disk drive (HDD), or a solid state drive (SSD). For example, the network may be a controller area network (CAN) of a vehicle, a local area network (LAN), or the Internet. The external I/F 24 can have any configuration that can achieve connection to an external device or communication with an external device. The external I/F 24 may be provided for each external device.

The light-source driver 25 is an electric circuit that outputs a drive signal such as a drive voltage to the light-source device 12 in accordance with the received control signal.

The movable-device driver 26 is an electric circuit that outputs a drive signal such as a drive voltage to the movable device 13 in accordance with the received control signal.

In the control device 11, the CPU 20 acquires optical-scanning information from an external device or a network through the external I/F 24. Note that any configuration may be used as long as the CPU 20 can acquire the optical scanning information, and the optical scanning information may be stored in the ROM 22 or in the FPGA 23 in the control device 11, or a storage device such as an SSD may be newly provided in the control device 11 and the optical scanning information may be stored in the storage device.

In this case, the optical-scanning information is information indicating the way of optical scanning to be performed on the target surface 15. The optical-scanning information is, for example, image data when an image is displayed by optical scanning. For another example, the optical-scanning information is writing data indicating the order and portion of writing when optical writing is performed by optical scanning. For further example, the optical-scanning information is irradiation data indicating the timing and range of irradiation with light for distance measurement when distance measurement is performed by optical scanning.

The control device 11 can provide the functional configuration described below by using instructions from the CPU 20 and the hardware configuration illustrated in FIG. 26.

Figure 27:
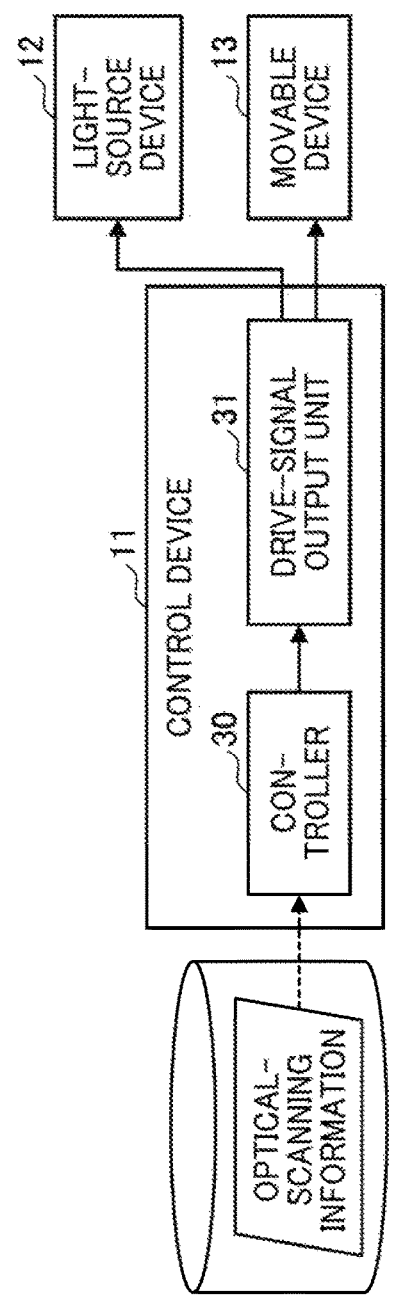
FIG. 27 is a functional block diagram of a control device according to an embodiment of the present disclosure.

Next, the functional configuration of the control device 11 of the optical scanning system 10 is described below referring to FIG. 27. FIG. 27 is a functional block diagram of the control device 11 of the optical scanning system 10, according to an embodiment of the present disclosure.

As illustrated in FIG. 27, the control device 11 has the functions of a controller 30 and a driving-signal output unit 31.

The controller 30 is implemented by, for example, the CPU 20 and the FPGA 23. The controller 30 acquires optical-scanning information from an external device, converts the optical-scanning information into a control signal, and outputs the control signal to the drive-signal output unit 31. For example, the controller 30 acquires image data serving as the optical-scanning information from an external device or the like, generates a control signal from the image data through predetermined processing, and outputs the control signal to the drive-signal output unit 31.

The drive-signal output unit 31 is implemented by, for example, the light-source driver 25 and the movable-device driver 26. The drive-signal output unit 31 outputs a drive signal to the light-source device 12 or the movable device 13 based on the received control signal.

The drive signal is a signal for controlling the driving of the light-source device 12 or the movable device 13. For example, the drive signal of the light-source device 12 is a drive voltage used to control the irradiation timing and irradiation intensity of the light source. Moreover, for example, the drive signal in the movable device 13 is a drive voltage used to control the timing and range of motion where the reflecting surface 14 provided in the movable device 13 is moved.

Figure 28:
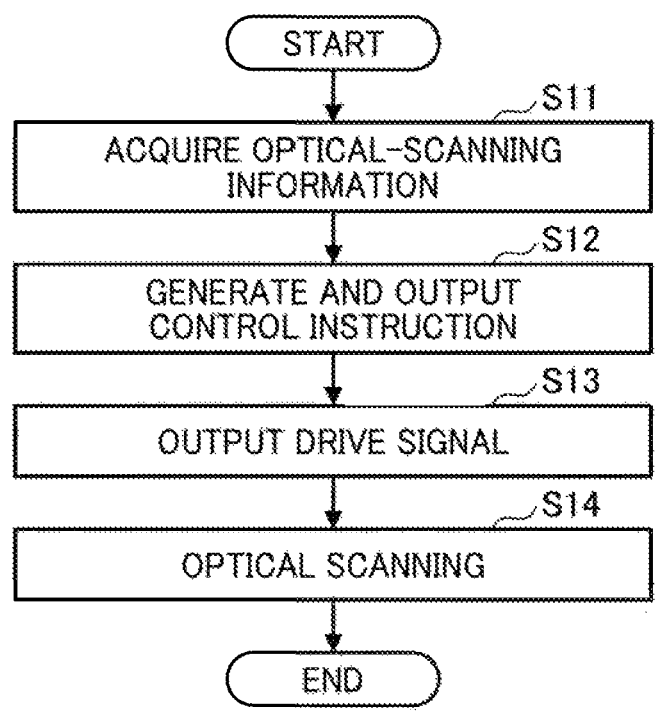
FIG. 28 is a flow chart of the processing relating to the optical scanning system, according to an embodiment of the present disclosure.

Next, the process of optically scanning the target surface 15 performed by the optical scanning system 10 is described referring to FIG. 28. FIG. 28 is a flowchart of processing relating to the optical scanning system 10, according to an embodiment of the present disclosure.

In step S11, the controller 30 acquires optical-scanning information from, for example, an external device.

In step S12, the controller 30 generates control signals from the acquired optical-scanning information, and outputs the control signals to the drive-signal output unit 31.

In step S13, the drive-signal output unit 31 outputs drive signals to the light-source device 12 and the movable device 13 based on the received control signals.

In step S14, the light-source device 12 emits light based on the received drive signal. In addition, the movable device 13 moves the reflecting surface 14 based on the received drive signal. The driving of the light-source device 12 and the movable device 13 causes light to be deflected in a given direction, and optical scanning is performed.

In the above-described optical scanning system 10, a single control device 11 has a device and a function for controlling the light-source device 12 and the movable device 13. However, a control device for the light-source device and a control device for the movable device may be separate elements.

In the above-described optical scanning system 10, a single control device 11 has the functions of the controller 30 and the functions of the drive-signal output unit 31 for the light-source device 12 and the movable device 13. These functions may be implemented by separate elements. For example, a drive-signal output device including a drive-signal output unit 31 may be provided in addition to the control device 11 including the controller 30. An optical deflection system that performs optical deflection may be configured by the control device 11 and the movable device 13 provided with the reflecting surface 14, which are elements of the above optical scanning system 10.

Incorporating the movable device according to the present embodiment into an optical scanning system enables stable rotation and light deflection of the movable part, which further achieves highly accurate optical scanning.

An image projection apparatus, to which the movable device according to the embodiment is applied, is described next in detail referring to FIGS. 29 and 30.

Figure 29:
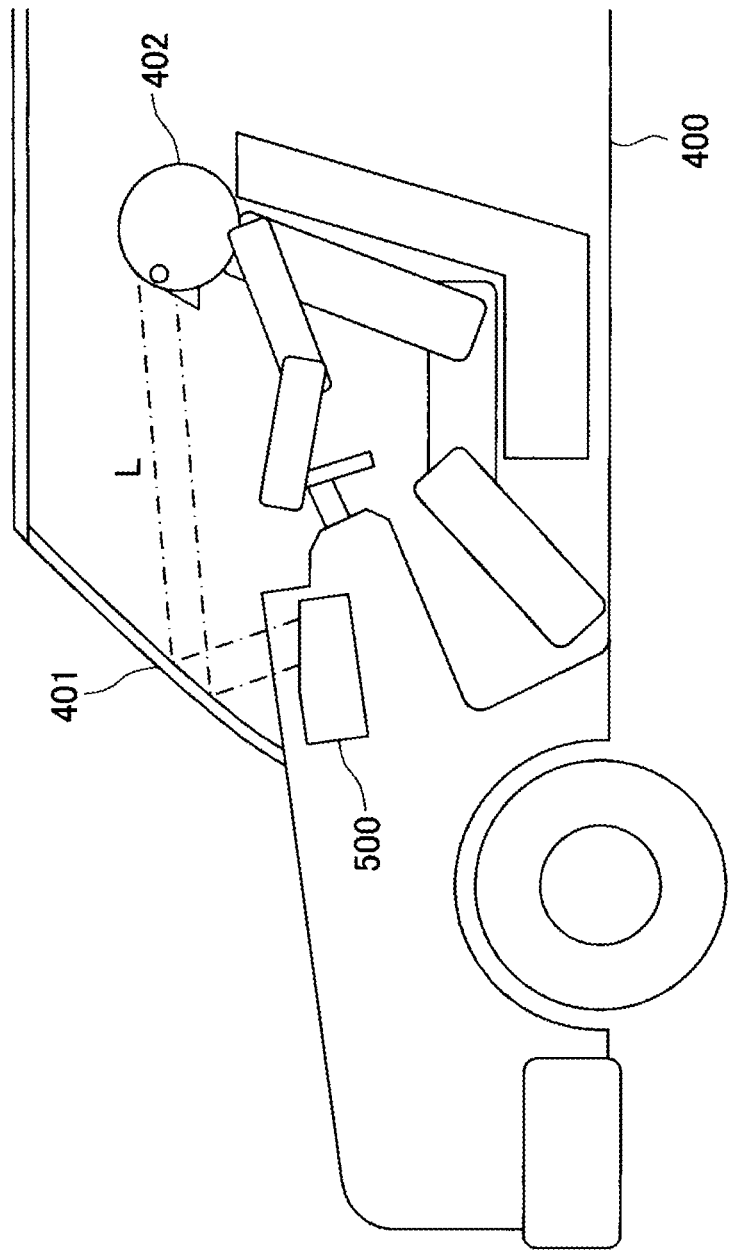
FIG. 29 is a schematic view of a vehicle equipped with a heads-up display (HUD) according to an embodiment of the present disclosure.

FIG. 29 is a schematic view of a vehicle 400 equipped with a HUD 500 as an example of an image projection apparatus according to an embodiment. FIG. 30 is a schematic view of the HUD 500 according to an embodiment of the present disclosure.

The image projection apparatus projects an image by optical scanning, and is, for example, a HUD.

As illustrated in FIG. 29, for example, the HUD 500 is provided near a front windshield such as a windshield 401 of the vehicle 400. Projection light L that is emitted from the HUD 500 is reflected by the windshield 401 and directed to a viewer (a driver 402) as a user. Accordingly, the driver 402 can visually recognize as a virtual image an image or the like projected by the HUD 500. Alternatively, a combiner may be disposed on the inner wall surface of the windshield 401 so that the user can visually recognize a virtual image formed by the projection light that is reflected by the combiner.

Figure 30:
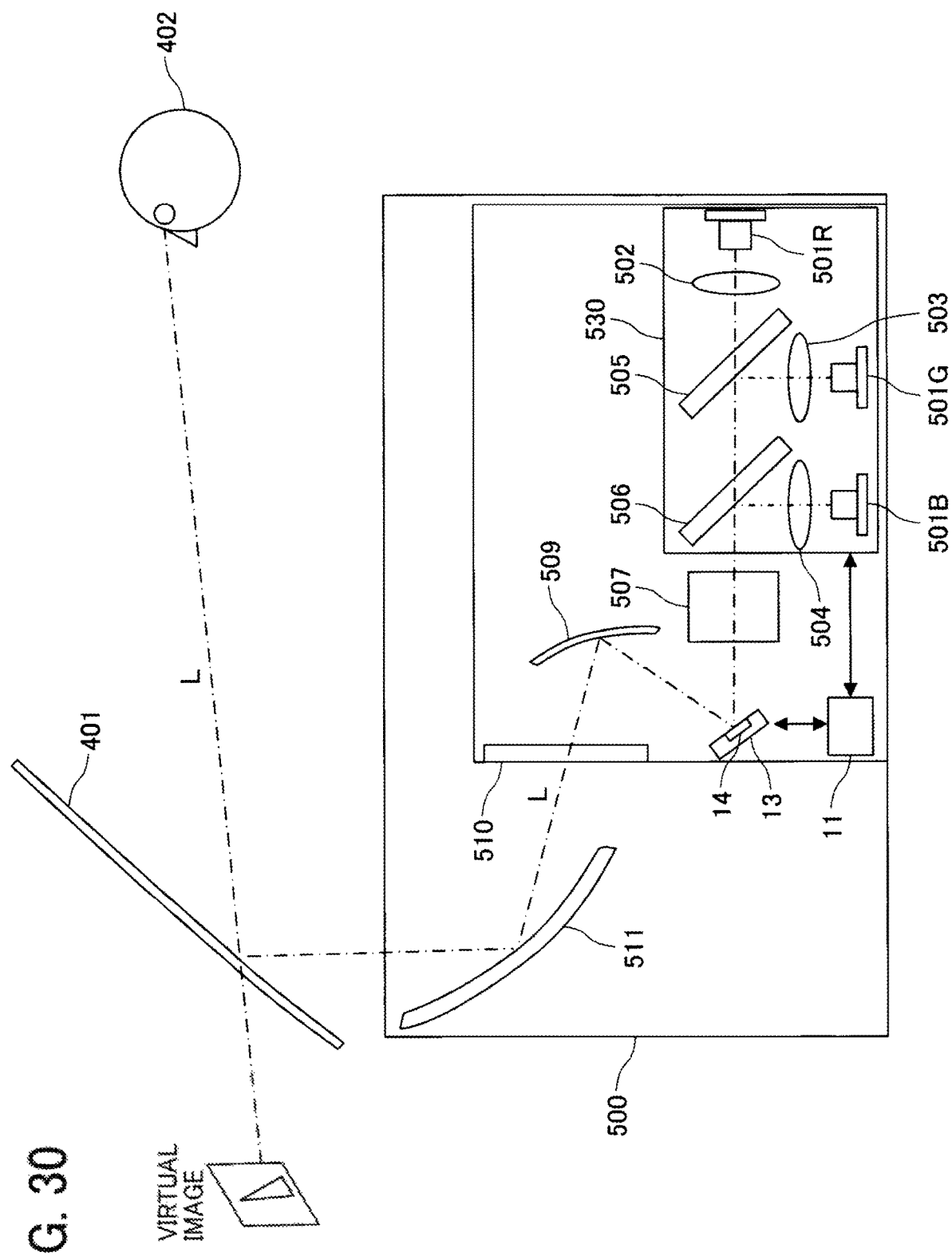
FIG. 30 is a schematic view of a HUD according to an embodiment of the present disclosure.

As illustrated in FIG. 30, the HUD 500 emits laser beams through red, green, and blue laser beam sources 501R, 501G, and 501B, respectively. The emitted laser beams pass through an incident optical system, and then are deflected by the movable device 13 including the reflecting surface 14. The incident optical system includes collimator lenses 502, 503, and 504 respectively provided for the laser-beam sources 501R, 501G, and 501B, two dichroic mirrors 505 and 506, and a light-intensity adjuster 507. The deflected laser beams pass through a projection optical system and are projected onto a screen. The projection optical system includes a free-form surface mirror 509, an intermediate screen 510, and a projection mirror 511. In the HUD 500, the laser-beam sources 501R, 501G, 501B, the collimator lenses 502, 503, 504, and the dichroic mirrors 505, 506 are combined as a single unit that is an optical housing serving as a light source unit 530.

The HUD 500 projects an intermediate image displayed on the intermediate screen 510 onto the windshield 401 of the vehicle 400 to allow the driver 402 to visually recognize the intermediate image as a virtual image.

The laser beams of RGB colors emitted from the laser-beam sources 501R, 501G, and 501B are approximately collimated by the collimator lens 502, 503, and 504, and are combined by the two dichroic mirrors 505 and 506. The light intensity of the combined laser beams is adjusted by the light-intensity adjuster 507, and then two-dimensional scanning is performed by the movable device 13 provided with the reflecting surface 14. The projection light L that has been two-dimensionally scanned by the movable device 13 is reflected by the free-form surface mirror 509 so as to correct the distortion, and then is focused onto the intermediate screen 510 thus to display an intermediate image. The intermediate screen 510 includes a microlens array in which a plurality of microlenses are two-dimensionally arranged, and enlarges the projection light L incident on the intermediate screen 510 in units of microlens.

The movable device 13 moves the reflecting surface 14 biaxially in a reciprocating manner to perform two-dimensional scanning with the projection light L incident on the reflecting surface 14. The driving of the movable device 13 is controlled in synchronization with the light-emitting timings of the laser-beam sources 501R, 501G, and 501B.

In the above description, the heads-up display 500 is described as an example of the image projection apparatus. However, no limitation is indicated thereby, and the image projection apparatus may be any apparatus that performs optical scanning, using the movable device 13 provided with the reflecting surface 14, to project an image. For example, the present disclosure is also applicable to a projector that is placed on a desk or the like and projects an image on a display screen, a head-mounted display device that is incorporated in a wearable member on the head of the observer, for example, and that projects an image on a reflective-and-transmissive screen of the wearable member or on an eyeball as a screen, and the like.

The image projection apparatus may be incorporated in, not only the vehicle or the wearable member, but also, for example, a mobile body such as an aircraft, a ship, or a mobile robot; or an immobile body such as an operation robot that operates a driving target such as a manipulator without moving from the installed location.

Incorporating the movable device according to the present embodiment into an image projection apparatus enables stable rotation and light deflection of the movable part, which achieves projection of an image with higher quality.

Next, an optical writing device to which the movable device 13 according to an embodiment of the present disclosure is applied is described in detail with reference to FIGS. 31 and 32.

Figure 31:
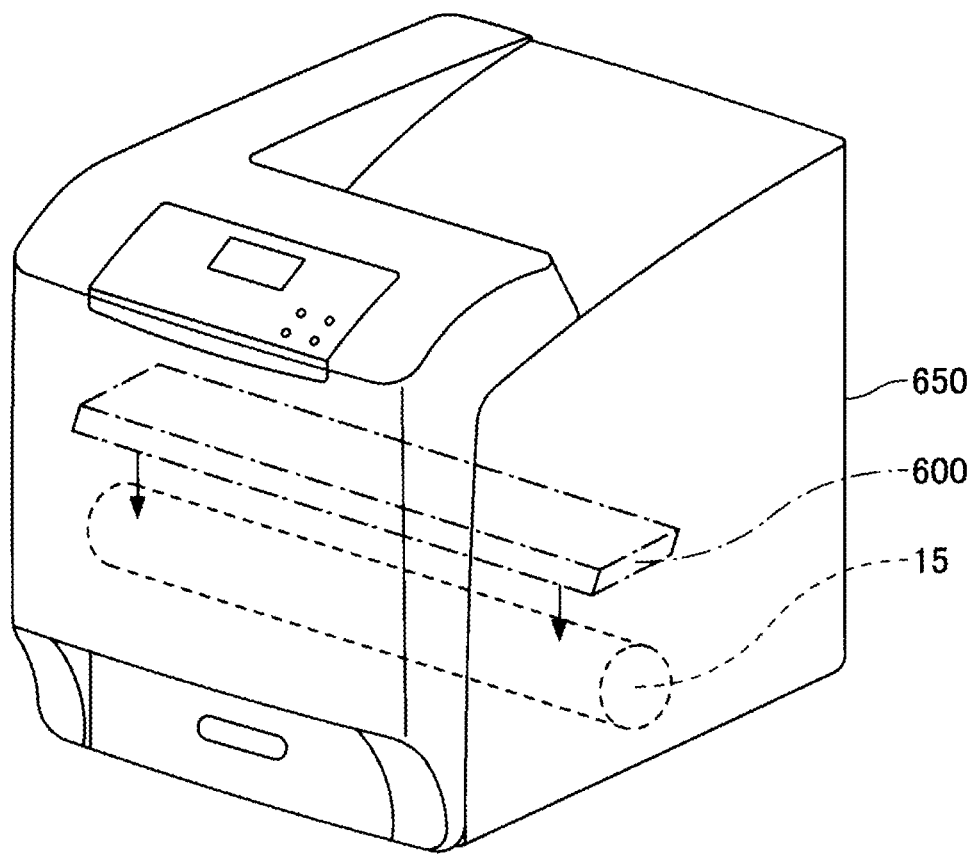
FIG. 31 is a schematic view of an image forming apparatus equipped with an optical writing device, according to an embodiment of the present disclosure.

FIG. 31 is an illustration of an image forming apparatus incorporating an optical writing device 600, according to an embodiment of the present disclosure. FIG. 32 is a schematic view of the optical writing device according to an embodiment of the present disclosure.

As illustrated in FIG. 31, the optical writing device 600 is used as a component of an image forming apparatus typified by, for example, a laser printer 650 having printer functions using laser beams. In the image forming apparatus, the optical writing device 600 performs optical scanning on a photoconductor drum, which is the target surface 115, by using one or more laser beams, thereby performing optical writing on the photoconductor drum.

Figure 32:
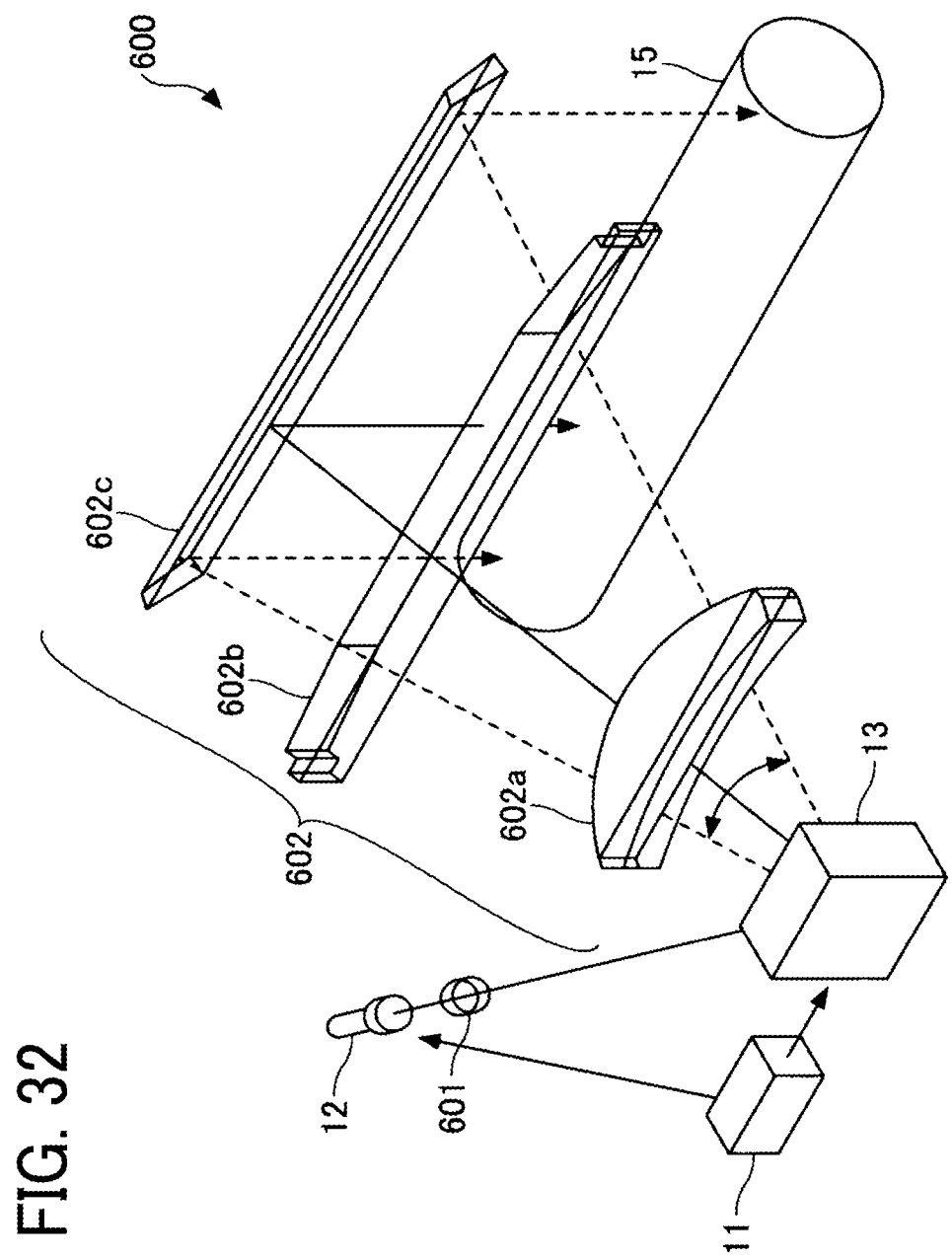
FIG. 32 is a schematic view of an example of the optical writing device.

As illustrated in FIG. 32, in the optical writing device 600, a laser beam from the light-source device 12 such as a laser element passes through an image forming optical system 601 such as a collimator lens and is then deflected uniaxially or biaxially by the movable device 13 having the reflecting surface 14. The laser beam deflected by the movable device 13 passes through a scanning optical system 602 constituted by a first lens 602a, a second lens 602b, and a reflecting mirror unit 602c, and is emitted onto the target surface 15 (e.g., a photoconductor drum or photosensitive paper), and thereby optical writing is performed. The scanning optical system 602 forms a laser beam in the form of a spot on the target surface 15. The light-source device 12 and the movable device 13 including the reflecting surface 14 are driven based on the control of the control device 11.

As described above, the optical writing device 600 is used as a component of an image forming apparatus having a printer function using laser beams. Moreover, by employing another scanning optical system to perform scanning in a biaxial manner in addition to the uniaxial manner, the optical writing device 600 can also be used as a component of an image forming apparatus such as a laser label apparatus that deflects laser beams to perform optical scanning on thermal media and print letters by heating.

The movable device 13 including the reflecting surface 14 to be applied to the optical writing device is advantageous in saving power of the optical writing device because power consumption for driving the movable device 13 is less than that for driving a rotational polygon mirror or the like. The movable device 13 makes a smaller wind noise when the reflector base oscillates compared with a rotational polygon mirror, and thus is advantageous in achieving low noise of the optical writing device. The optical writing device requires much smaller installation space than the installation space of a rotational polygon mirror, and the amount of heat generated by the movable device 13 is small. Accordingly, downsizing is easily achieved, and thus the optical writing device is advantageous in downsizing the image forming apparatus.

Incorporating the movable device according to the present embodiment into an optical writing device enables stable rotation light deflection of the movable part, which provides more accurate optical writing.

Figure 33:
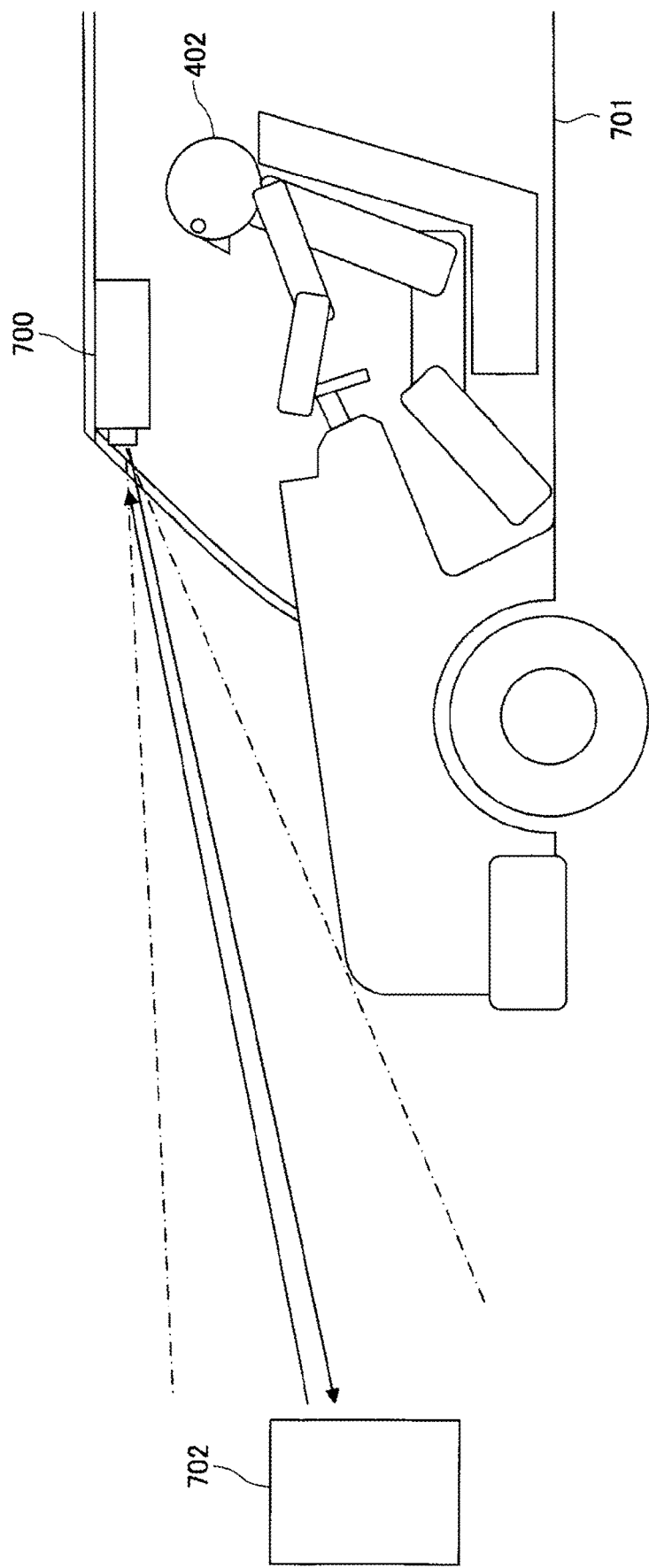
FIG. 33 is a schematic view of a vehicle equipped with a laser imaging detection and ranging (LiDAR) device, according to an embodiment of the present disclosure.
Figure 34:
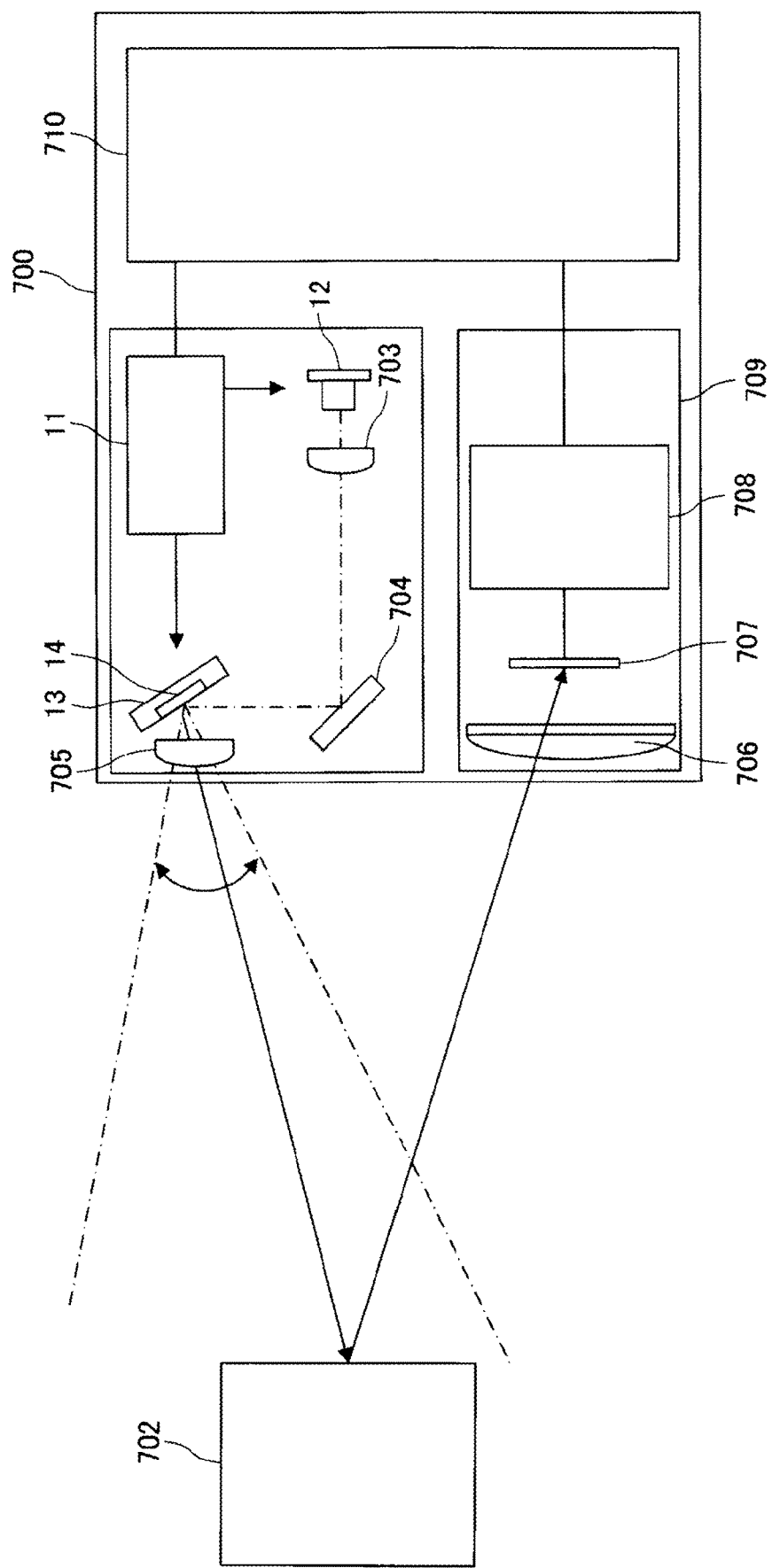
FIG. 34 is a schematic view of the LiDAR device according to an embodiment of the present disclosure.

Next, a distance measurement device to which the movable device according to the embodiment is applied is described in detail referring to FIGS. 33 and 34.

FIG. 33 is a schematic view of a vehicle equipped with a laser imaging detection and ranging (LiDAR) device as an example of a distance measurement device. FIG. 34 is a schematic view of an example of the LiDAR device.

The distance measurement device measures a distance in a target direction, and is, for example, a LiDAR device.

As illustrated in FIG. 33, for example, a LiDAR device 700 is provided for a vehicle 701 to perform optical scanning in a target direction and receive the light reflected from an object 702 that exists in the target direction. Accordingly, the LiDAR device 700 can measure the distance to the object 702. In addition to the vehicle, the LiDAR device 700 is mounted on a mobile body such as a drone.

As illustrated in FIG. 34, the laser beams emitted from a light-source device 12 pass through an incident optical system, and then are caused to perform scanning uniaxially or biaxially using the movable device 13 including the reflecting surface 14. The incidence optical system includes a collimator lens 703 that serves as an optical system that collimates divergent beams into approximately parallel beams, and a planar mirror 704. The parallel beams are emitted to the object 702 ahead of the device, as passing through, for example, a projection lens 705 that serves as a projection optical system. The driving of the light-source device 12 and the movable device 13 is controlled by the control device 11. The light reflected by the object 702 is detected by a photosensor 709. More specifically, the reflected light passes through, for example, a condenser lens 706 that serves as an incident-light receiving and detecting optical system, and is received by an image sensor 707. Then, the image sensor 707 outputs a detected signal to a signal processing circuit 708. The signal processing circuit 708 performs predetermined processing on the received detected signal, such as binarization or noise processing, and outputs the result to a distance measuring circuit 710.

The distance measuring circuit 710 determines whether the object 702 is present based on the time difference between the timing at which the light-source device 12 emits laser beams and the timing at which the photosensor 709 receives the laser beams or the phase difference per pixel of the image sensor 707 that have received the laser beams. Moreover, the distance measuring circuit 710 calculates distance information indicating the distance from the object 702.

The movable device 13 including the reflecting surface 14 is less likely broken and is compact compared with a polygon mirror, and thus, a highly durable and compact LiDAR device can be provided. Such a LiDAR device is attached to, for example, a vehicle, an aircraft, a ship, a robot, or the like, and can perform optical scanning within a predetermined range to determine whether an obstacle is present or absent to measure the distance from the obstacle. The installation position of the LiDAR device 700 is not limited to an upper and front portion of the vehicle 701, and the LiDAR device 700 may be mounted at a side surface or a rear portion of the vehicle 701.

In the present embodiment, the LiDAR device 700 is described as an example of the distance measuring equipment. However, no limitation is intended thereby. The distance measuring equipment may be any apparatus that performs optical scanning by controlling the movable device 13 provided with the reflecting surface 14, using the control device 11, and that receives the receives the reflected laser beam using a photodetector to measure the distance to the object 702.

For example, the present disclosure is also applicable to a biometric authentication apparatus, a security sensor, or a component of a three-dimensional scanner, for example. The biometric authentication apparatus performs optical scanning on a hand or face to obtain distance information, calculates object information such as the shape of the object based on the distance information, and refers to records to recognize the object. The security sensor performs optical scanning in a target range to recognize an incoming object. The three-dimensional scanner performs optical scanning to obtain distance information, calculates object information such as the shape of the object based on the distance information to recognize the object, and outputs the object information in the form of three-dimensional data.

Incorporating the movable device according to the present embodiment into a distance measurement device enables stable rotation and light deflection of the movable part, which provides more accurate distance measurement.

Figure 35:
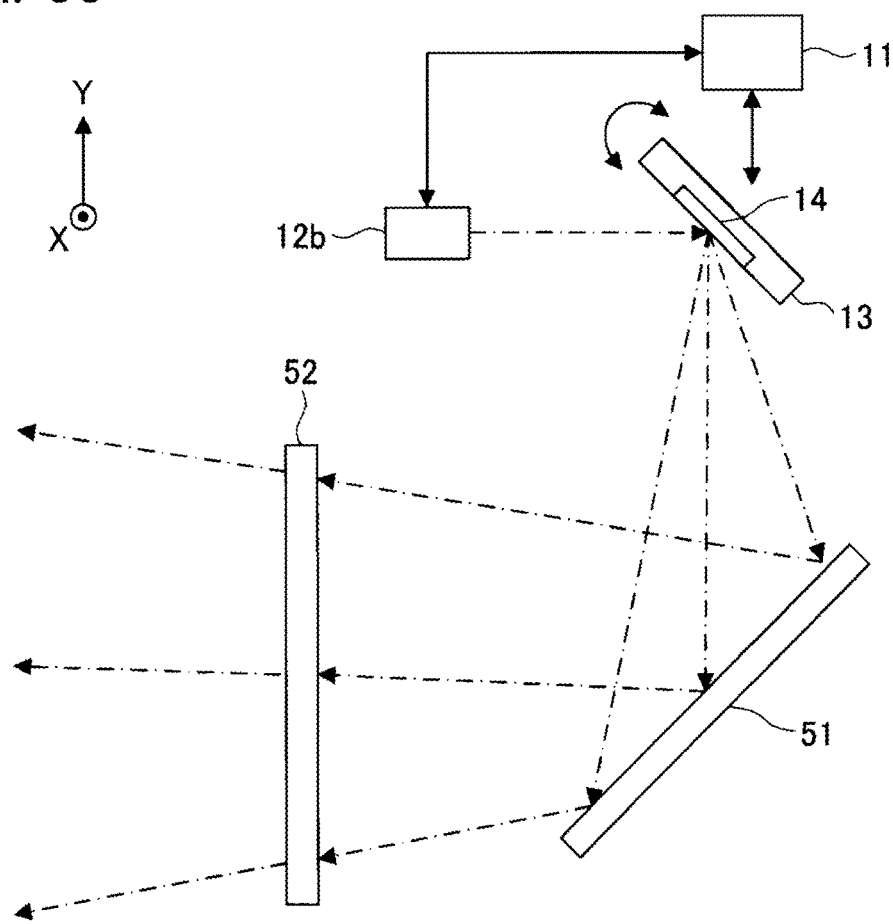
FIG. 35 is a schematic view of an example of a configuration of a laser headlamp.

Next, a laser headlamp 50 in which the movable device of the embodiment is applied to a headlight of a vehicle is described referring to FIG. 35. FIG. 35 is an illustration of the configuration of a laser headlamp 50 according to an embodiment of the present disclosure.

The laser headlamp 50 includes a control device 11, a light-source device 12b, a movable device 13 including a reflecting surface 14, a mirror 51, and a transparent plate 52.

The light-source device 12b is a light source that emits blue laser beams. The laser beam emitted from the light-source device 12b is incident on the movable device 13 and is reflected by the reflecting surface 14. The movable device 13 moves the reflecting surface 14 in the XY-direction based on the signal from the control device 11, and performs two-dimensional scanning using the blue laser beam emitted from the light-source device 12b in the XY-direction.

The scanning light of the movable device 13 is reflected by the mirror 51, and is incident on the transparent plate 52. The transparent plate 52 is coated with a yellow phosphor on the front surface or the back surface. The blue laser beams that are reflected by the mirror 51 are converted into white light whose color is within the range of the statutory color for a headlight as passing through the yellow phosphor (fluorescent material) of the transparent plate 52. Accordingly, the front of the vehicle is illuminated with white light from the transparent plate 52.

The scanning light of the movable device 13 scatters in a predetermined manner as passing through the fluorescent material of the transparent plate 52. Accordingly, glare is attenuated at an illuminated target in the area ahead of the vehicle.

When the movable device 13 is applied to a headlight of a vehicle, the color of light beams from the light-source device 12b and the color of the phosphor are not limited to blue and yellow, respectively. For example, the light-source device 12b may emit near-ultraviolet light, and the transparent plate 52 may be coated with homogenized mixture of a plurality of kinds of fluorescent materials of red-green-blue (RGB) trichromatic colors. In this case as well, the light passing through the transparent plate 52 can be converted into white light, and the front of the vehicle can be illuminated with white light.

Incorporating the movable device according to the present embodiment into a distance measurement device enables stable rotation and light deflection of the movable part of the light deflection, which provides a stable light irradiation.

Next, an HMD 60 to which the movable device 13 according to an embodiment of the present disclosure is applied is described in detail with reference to FIGS. 36 to 38. Note that the HMD 60 is a head-mounted display that can be mounted on a human head, and can be shaped like, for example, glasses. In the following description, such a head-mounted display may be referred to simply as an HMD.

Figure 36:
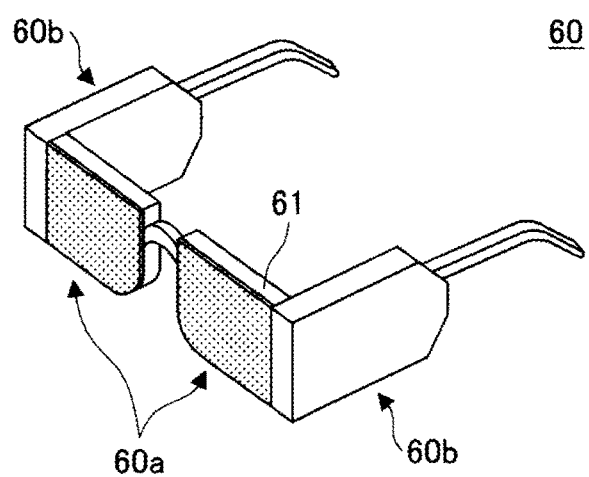
FIG. 36 is a schematic perspective view of the configuration of a head-mounted display (HMD) according to an embodiment of the present disclosure.

FIG. 36 is a perspective view of the appearance of the HMD 60. In FIG. 36, the HMD 60 includes a pair of a front 60a and a temple 60b on each of the left and right, which are approximately symmetrically arranged. The front 60a can include, for example, a light guide plate 61. An optical system, a control device, and the like, can be incorporated in the temple 60b.

Figure 37:
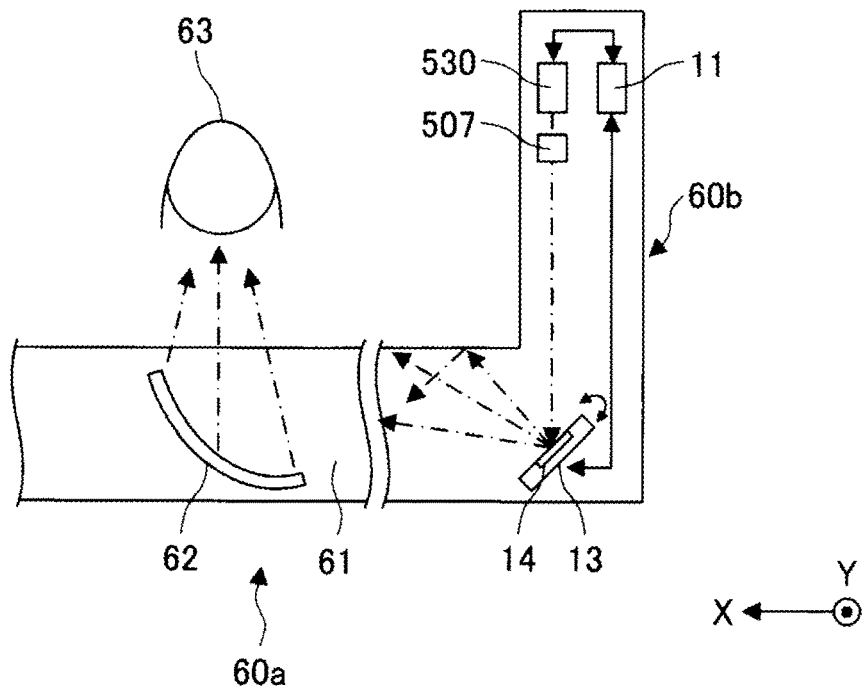
FIG. 37 is an illustration of the configuration of the HMD according to an embodiment of the present disclosure.

FIG. 37 is an illustration of a configuration of a part of the HMD 60. Although the configuration for the left eye is illustrated in FIG. 37, the HMD 60 has a configuration similar to that for the right eye.

The HMD 60 includes a control device 11, a light source unit 530, a light-intensity adjuster 507, a movable device 13 including a reflecting surface 14, a light guide plate 61, and a half mirror 62.

The light source unit 530 includes, as described above, the laser-beam sources 501R, 501G, and 501B, the collimator lenses 502, 503, and 504, and the dichroic mirrors 505 and 506, and these elements are combined as a single unit in the optical housing. In the light source unit 530, the laser beams of the RGB colors that are emitted from the laser-beam sources 501R, 501G, and 501B are combined by the two dichroic mirrors 505 and 506. The combined parallel light is emitted from the light source unit 530.

The light intensity of the combined laser beams from the light source unit 530 is adjusted by the light-intensity adjuster 507, and then the light is incident on the movable device 13. The movable device 13 moves the reflecting surface 14 in the XY-direction based on the signal from the control device 11, and performs two-dimensional scanning with the light emitted from the light source unit 530. The driving of the movable device 13 is controlled in synchronization with the light emission timings of the laser-beam sources 501R, 501G, and 501B, and a color image is formed with the scanning light.

The scanning light of the movable device 13 is incident on the light guide plate 61. The light guide plate 61 reflects the scanning light on the inner wall, and guides the scanning light to the half mirror 62. The light guide plate 61 is formed by, for example, resin that has transparency to the wavelength of the scanning light.

The half mirror 62 reflects the light that is guided through the light guide plate 61 to the rear side of the HMD 60, and the reflected light exits towards an eye of an wearer 63 of the HMD 60. The half mirror 62 has, for example, a free-form surface shape. The image of the scanning light is reflected by the half mirror 62, and then is formed on the retina of the wearer 63. The image of the scanning light is formed on the retina of the wearer 63 due to the reflection at the half mirror 62 and the effect of the crystalline lenses of eyeballs. Moreover, due to the reflection at the half mirror 62, the spatial distortion of the image is corrected. The wearer 63 can observe an image formed by the light of scanning in the XY direction.

The wearer 63 observes an image of external light superposed on the image of the scanning light because of the half mirror 62. The half mirror 62 may be replaced with a mirror to exclude the extraneous light. In such a configuration, only the image that is formed by scanning light can be observed.

Incorporating the movable device according to the present embodiment into a HMD enables a stable rotation and light deflection of the movable part, which achieves formation of an image with higher quality.

Next, the packaging of the movable device 13 according to an embodiment of the present disclosure is described with reference to FIG. 38.

Figure 38:
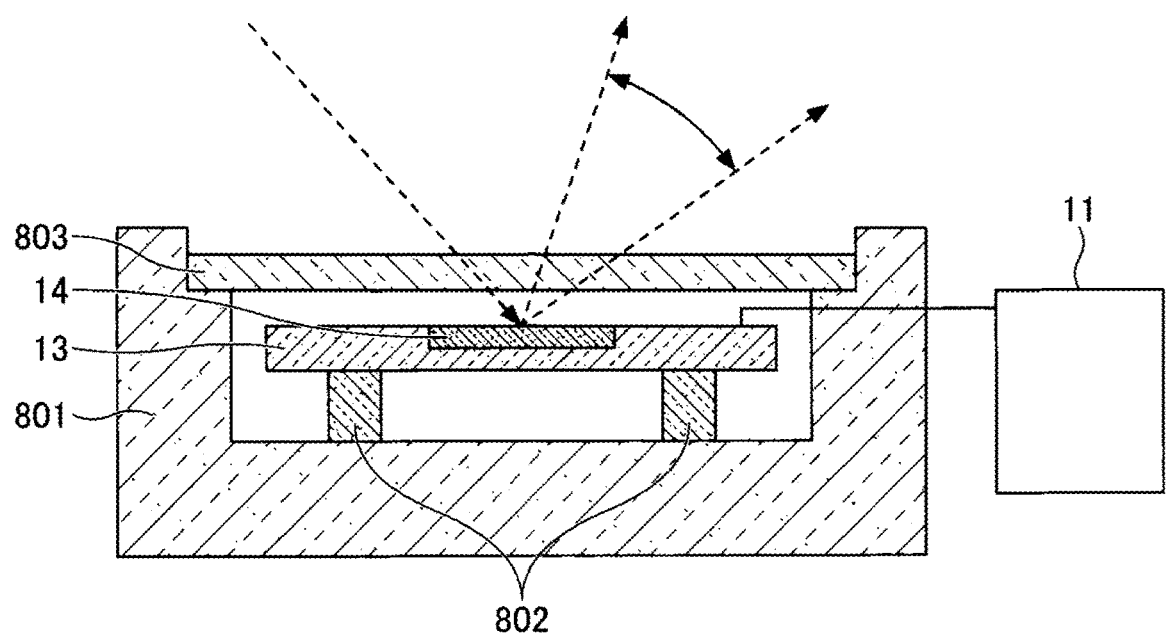
FIG. 38 is a schematic view of a packaged movable device.

FIG. 38 is a schematic view of an example of a packaged movable device 13.

As illustrated in FIG. 38, the movable device 13 is mounted on a mounting member 802 inside a package member 801. The package member 801 is partly covered with and sealed by a transmissive member 803 so that the movable device 13 is packaged. The package contains inert gas such as nitrogen and is sealed. This configuration can substantially prevent the deterioration of the movable device 13 due to oxidation, and increase the durability against changes in environment such as temperature.

Although the embodiments of the present disclosure have been described above, the present disclosure is not limited to such specific embodiments, and various modifications and changes can be made without departing from the spirit and scope of the present disclosure as set forth in the appended claims.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A movable device comprising:
    a light deflector including a movable structure rotatable about a predetermined axis;
    a mount including a pair of stationary structures to which the light deflector is secured; and
    a substrate attached to the mount,
    the substrate having a through hole between the pair of stationary structures,
    wherein the mount is between the light deflector and the substrate in a lamination direction of the light deflector, the mount, and the substrate, and
    each of the pair of stationary structures includes:
    a first stationary portion extending in a direction orthogonal to the predetermined axis;
    a second stationary portion at one end of the first stationary portion; and
    a third stationary portion at the other end of the first stationary portion, the second stationary portion and the third stationary portion extending along the predetermined axis,
    the second stationary portion of one of the pair of stationary structures faces the second stationary portion of the other one of the pair of stationary structures along the predetermined axis, and
    the third stationary portion of one of the pair of stationary structures faces the third stationary portion of the other one of the pair of stationary structures along the predetermined axis.

2. The movable device according to claim 1, further comprising a connecting structure connecting the pair of stationary structures.

3. The movable device according to claim 1,
    wherein the movable structure includes a reflecting surface, and
    wherein the movable structure is rotatable while performing galvano scanning.

4. The movable device according to claim 1,
    wherein the light deflector further includes a pair of supporters on both sides of the movable structure, respectively, and
    wherein the pair of supporters has a meandering structure.

5. A laser imaging detection and ranging device comprising the movable device according to claim 1.

6. An image forming apparatus comprising the movable device according to claim 1.

7. An image projection apparatus comprising:
    a light source to emit light; and
    the movable device according to claim 1 to deflect the light.

8. The movable device according to claim 1,
    wherein the mount is made of ceramic, silicon, metal, or resin.

9. The movable device according to claim 1, further comprising a connecting structure connecting the second stationary portion of the one of the pair of stationary structures to the second stationary portion of the other one of the pair of stationary structures.

10. The movable device according to claim 1, further comprising a connecting structure connecting the third stationary portion of the one of the pair of stationary structures to the third stationary portion of the other one of the pair of stationary structures.

11. The movable device according to claim 1, further comprising:
    a first connecting structure connecting the second stationary portion of the one of the pair of stationary structures to the second stationary portion of the other one of the pair of stationary structures; and
    a second connecting structure connecting the third stationary portion of the one of the pair of stationary parts to the third stationary portion of the other one of the pair of stationary structures.

12. The movable device according to claim 1,
    wherein an open region is between the second stationary portion of the one of the pair of stationary structures and the second stationary portion of the other one of the pair of stationary structures.

13. The movable device according to claim 1,
    wherein an open region is between the third stationary portion of the one of the pair of stationary structures and the third stationary portion of the other one of the pair of stationary parts structures.

14. The movable device according to claim 1,
    wherein an open region is between the second stationary portion of the one of the pair of stationary structures and the second stationary portion of the other one of the pair of stationary structures, and
    another open region is between the third stationary portion of the one of the pair of stationary structures and the third stationary portion of the other one of the pair of stationary structures.

15. A mount comprising:
    a pair of stationary structures to secure a light deflector including a movable structure having a reflecting surface, the movable structure being rotatable around a predetermined axis; and
    a connecting structure connecting the pair of stationary structures at an opposite side of a light-deflector side of the pair of stationary structures,
    wherein an opening region is provided through which light reflected by the reflecting surface passes, and
    wherein the connecting structure has a smaller width in a direction orthogonal to the predetermined axis than the pair of stationary structures, and
    each of the pair of stationary structures includes:
    a first stationary portion extending in a direction orthogonal to the predetermined axis;
    a second stationary portion at one end of the first stationary portion; and a third stationary portion at the other end of the first stationary portion, the second stationary portion and the third stationary portion extending along the predetermined axis, the second stationary portion of one of the pair of stationary structures faces the second stationary portion of the other one of the pair of stationary structures along the predetermined axis, and the third stationary portion of one of the pair of stationary structures faces the third stationary portion of the other one of the pair of stationary structures along the predetermined axis.

16. The mount according to claim 15,
wherein the pair of stationary structures is attached to a substrate having a through hole such that the through hole is between the pair of stationary structures.

17. The mount according to claim 15,
wherein the connecting structure has a cross sectional shape of one of a rectangle, a trapezoid, a triangle, and a circle.

18. The mount according to claim 15,
wherein the predetermined axis is parallel to a longitudinal direction of the connecting structure.

19. A movable device comprising:
the mount according to claim 15; and
the light deflector attached to the pair of connecting structures.

* * * * *